(12) United States Patent
Yoshinaga

(10) Patent No.: US 7,786,908 B2
(45) Date of Patent: Aug. 31, 2010

(54) SUCCESSIVE APPROXIMATION TYPE A/D CONVERTER

(75) Inventor: Chikashi Yoshinaga, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 90 days.

(21) Appl. No.: 12/213,560

(22) Filed: Jun. 20, 2008

(65) Prior Publication Data

US 2008/0316080 A1    Dec. 25, 2008

(30) Foreign Application Priority Data

Jun. 22, 2007    (JP) .............................. 2007-164819

(51) Int. Cl.
*H03M 1/10* (2006.01)
(52) U.S. Cl. ..................................... 341/118; 341/172
(58) Field of Classification Search ................. 341/118, 341/120, 172
See application file for complete search history.

(56) References Cited

U.S. PATENT DOCUMENTS

| | | | | |
|---|---|---|---|---|
| 4,399,426 A | * | 8/1983 | Tan | 341/120 |
| 4,476,456 A | * | 10/1984 | Domogalla | 341/118 |
| 4,517,549 A | * | 5/1985 | Tsukakoshi | 341/172 |
| 4,803,462 A | * | 2/1989 | Hester et al. | 341/172 |
| 4,989,002 A | * | 1/1991 | Tan | 341/172 |
| 5,852,415 A | * | 12/1998 | Cotter et al. | 341/120 |

FOREIGN PATENT DOCUMENTS

JP    7-86947    3/1995

\* cited by examiner

*Primary Examiner*—Howard Williams
(74) *Attorney, Agent, or Firm*—McGinn IP Law Group, PLLC

(57) ABSTRACT

A successive approximation type A/D converter includes a main capacitance array connected with a common connection node; a correction capacitance array; a voltage comparator configured to detect a voltage of the common connection node; and a successive approximation register in which a value is set based on an output of the voltage comparator. A first control circuit changes voltages applied to capacitance elements of the main capacitance array and the correction capacitance array based on a value set in the successive approximation register. A second control circuit responds to a control signal to connect the main capacitance array to an input voltage signal or a first predetermined voltage, and the correction capacitance array to the common connection node or a second predetermined voltage.

7 Claims, 21 Drawing Sheets

SUCCESSIVE APPROXIMATION TYPE A/D CONVERTER

INCORPORATION BY REFERENCE

This patent application is based on Japanese Patent Application No. 2007-164819 filed Jun. 22, 2007. The disclosure thereof is incorporated herein by reference.

BACKGROUND OF THE INVENTION

1. Field of the Invention

The present invention relates to an A/D (analog-to-digital) converter and, more specifically, to a successive approximation type A/D converter.

2. Description of Related Art

Demands for improving the accuracy and operation speed of a successive approximation type A/D converter are increased more and more. The successive approximation type A/D converter is provided with a built-in voltage comparator. It is preferable that the built-in voltage comparator has a high gain and a low offset in order to achieve an accurate A/D conversion by the successive approximation type A/D converter. Further, it is preferable that the built-in voltage comparator operates at a high speed in order to achieve high-speed A/D conversion.

In designing the voltage comparator, attention should be paid a trade-off relation between the offset and the operation speed. In order to keep a small offset, it is necessary to design a device size to be large. However, an increase in the device size causes an increase in a parasitic capacitance, which makes it difficult to improve the operation speed of the voltage comparator. Further, when the element size is designed to be large, a core size becomes increased, which results in increasing a chip size as well.

For overcoming such problems, a technique is known that corrects the offset of the voltage comparator by adding and controlling a capacitance element used for correction (for example, see Japanese Patent Application Publication (JP-A-Heisei 7-86947).

FIG. 1 is a circuit block diagram showing a configuration of an A/D converter disclosed in Japanese Patent Application Publication (JP-A-Heisei 7-86947). The A/D converter shown in FIG. 1 is a successive approximation type A/D converter which includes a higher 10-bit capacitance array and has 10-bit resolution. As shown in FIG. 1, an analog input voltage signal Ain 101, an upper-limit reference voltage (VT) 102, and a lower-limit reference voltage (VB) 103 are supplied to the successive approximation type A/D converter.

The successive approximation type A/D converter includes a sample voltage supplying line 104, a first switch 105, a main capacitance array 106, a correction capacitance array 107, a main switch group 108, a correction switch group 109, a common connection node 110 of the capacitance arrays, a voltage comparator 111, a successive approximation register SAR 114, a main switch control circuit 116, a correction switch control circuit 117, a first buffer 118, a first data bus 115, a latch circuit 140 for storing a correction data, and a first data bus 141 for supplying the correction data from the latch circuit 140 to the correction switch control circuit 117.

The first switch 105 is connected to an analog ground line AGND 130. The first switch 105 selects one of the analog input voltage signal 101 and the analog ground voltage signal 130, and supplies it to the sample voltage supplying line 104. The voltage comparator 111 includes a second switch 112 and an amplifier 120. The second switch 112 sets the voltage comparator 111 to an operating point. The voltage comparator 111 outputs a comparison result 113. The first data bus 115 supplies a value of the successive approximation register 114 to the main switch control circuit 116, the correction switch control circuit 117, and the first buffer 118. The first buffer 118 outputs a final A/D conversion result (A/D conversion result 119). The main switch control circuit 116 outputs a main switch control signal 124. The correction switch control circuit 117 outputs a correction switch control signal 123.

A control circuit 134 controls the first switch 105, the main switch control circuit 116, the correction switch control circuit 117, the latch circuit 140, the voltage comparator 111, the successive approximation register 114, and the first buffer 118. A clock signal 131 for operating the control circuit 134 is supplied to the control circuit 134. Further, the control circuit 134 is supplied with an A/D trigger 132 as a control signal to instruct to start an A/D conversion and a calibration external trigger 133 as the control signal to instruct to start an A/D conversion for detecting an offset error.

The control circuit 134 outputs a signal EOC 121 indicating an end of the A/D conversion, a signal TCG 122 to indicating a sampling period, and a control signal 135. The control signal 135 outputted from the control circuit 134 is a control signal for controlling circuit blocks, such as the first switch 105, the main switch control circuit 116, the correction switch control circuit 117, the latch circuit 140, the voltage comparator 111, the successive approximation register 114, and the first buffer 118.

An internal D/A converter of the A/D converter shown in FIG. 1 includes the main capacitance array 106. The main capacitance array 106 includes 11 binary-weighted capacitance elements. That is, the main capacitance array 106 includes capacitance elements $C_{00}$ and $C_0$ having a capacitance value (1C) of a unit capacitance element, a capacitance element $C_1$ having a capacitance value that is $2^1$ times of the unit capacitance element, and also capacitance elements of $C_2$-$C_9$ having capacitance values of $2^2$ times to $2^9$ times.

Further, the A/D converter includes a correction internal D/A converter (the correction capacitance array 107). The correction capacitance array 107 includes 7 binary-weighted capacitance elements. That is, the correction capacitance array 107 includes capacitance elements $CC_{00}$ and $CC_0$ having a capacitance value (1C) of a unit capacitance element, a capacitance element $CC_1$ having a capacitance value that is $2^1$ times of the unit capacitance element, and also capacitance. elements of $CC_2$-$CC_5$ having capacitance values of $2^2$ times to $2^5$ times. Therefore, this A/D converter can perform correction of the offset error with 6-bit resolution.

Details of the control circuit 134 and the control signal 135 will be described with reference to FIG. 2. A counter 201 counts the sampling period. The counter 201 starts a counting operation in response to the clock signal 131 when a count start setting signal 208 is set to a high level. Further, a trigger detecting circuit 202 detects that a calibration external trigger (instructing to start A/D conversion for detecting an offset error) 133 is set to the high level. An OR circuit 203 recognizes that either the A/D trigger (instructing to start A/D conversion) 132 or the calibration external trigger (instructing to start A/D conversion for detecting the offset error) 133 is set to the high level.

A second buffer output signal 210 is a control signal to activate the second switch 112 during the sampling period. A second buffer 204 buffers and outputs the second buffer output signal 210. A third buffer output signal 211 is a control signal to connect the main switch group 108 to the side of a sample voltage supplying line 104 during the sampling period.

The first switch 105 buffers and outputs the third buffer output signal 211. A first logic circuit output signal 212 is a control signal to connect the first switch 105 to an Ain side during the sampling period. A first logic circuit 206 outputs the first logic circuit output signal 212.

A second logic circuit output signal 213 is a control signal to connect the first switch 105 to an AGND side. A second logic circuit 207 outputs the second logic circuit output signal 213. The count start setting signal 208 is a signal for setting a start of the counting operation by the counter 201 based on an output signal of the OR circuit 203. A trigger detecting circuit output signal 209 is an output signal of the trigger detecting circuit 202. The trigger detecting circuit output signal 209 is supplied to the first logic circuit 206 and the second logic circuit 207, and controls whether to connect the first switch 105 to the Ain side or to the AGND side. Further, the trigger detecting circuit output signal 209 is supplied to the latch circuit 140, the main switch control circuit 116, the correction switch control circuit 117, and the first buffer 118, and is used to control whether to use the value of the first data bus 115 from the successive approximation register SAR 114 in the main switch control circuit 116 or in the correction switch control circuit 117, and to control whether to output the value from the first buffer 118 as the A/D conversion result 119 or to store it to the latch circuit 140.

Now, a basic operation of the A/D converter (to be referred to as A/D converting operation hereinafter) will be described. FIG. 3 is a timing chart for showing the operation of the A/D converter. This timing chart shows the operation of the A/D converter when correction of an offset error is not taken into consideration.

Referring to FIG. 3, the A/D converting operation is started by setting the A/D trigger (instructing to start an A/D conversion) 132 to the high level. When the A/D trigger 132 turns to the high level, the counter 201 starts a counting operation. The counter 201 outputs a TCG signal (indicating the sampling period) 122 in the high level until the counting operation during the sampling period ends. In FIG. 3, this period is shown as TCG. The A/D converter performs sampling of the analog input voltage signal Ain in the TCG period.

At this time, the second switch 112 of the voltage comparator 111 is activated in response to the second buffer output signal 210. When the second switch 112 is activated, the voltage comparator 111 biases the voltage of the common connection node 110 of the capacitance arrays to a constant voltage (VCOM). The first switch 105 connects the analog input voltage supplying line for supplying the analog input voltage signal Ain 101 to the sample voltage supplying line 104 in response to the first logic circuit output signal 212. Further, the main switch group 108 connects all the switches to the side of the sample voltage supplying line 104 in response to the third buffer output signal 211.

FIG. 4 is a schematic diagram showing the connection state at that time. As shown in FIG. 4, all the capacitance elements of the main capacitance array 106 are charged to the analog input voltage signal Ain 101 during the sampling period.

Returning to FIG. 3, the operation after the sampling period will be described. When a counting operation during a prescribed sampling period (a time of two clocks in FIG. 3) is completed, the counter 201 outputs a TCG (signal indicating the sampling period) 122 in the low level. In response to the TCG 122, the control circuit 134 outputs the second buffer output signal 210, the third buffer output signal 211, and the first logic circuit output signal 212. The control circuit 134 inactivates the second switch 112 and the first switch 105 in response to the second buffer output signal 210, the third buffer output signal 211, and the first logic circuit output signal 212.

At this time, the voltage of the common connection node 110 of the capacitance arrays turns to a high-impedance state. Therefore, all the capacitance elements of the main capacitance array 106 continue to keep the stored electric charges. An electric charge amount Q1 kept in the main capacitance array 106 can be expressed by the following equation (1).

$$Q1 = (1C \times 2^{10}) \times (Ain - VCOM) \quad (1)$$

Thereafter, in a period T0, the successive approximation register SAR 114 sets the logic value of a first bit (MSB) of the register itself to "1", when the sampling period ends. The first data bus 115 transfers the logic value of "1" for data $D_9$ in correspondence to the output of the successive approximation register SAR 114. In case of the basic A/D converting operation, the calibration external trigger (instructing to start A/D conversion for detecting an offset error) 133 remains in the low level. Thus, the correction switch group 109 of the trigger detecting circuit 202 also remains in the low level.

At this time, the main switch control circuit 116 controls the main switch group 108 so as to switch the voltage to be applied to each of the capacitance elements of the main capacitance array 106, based on a code of the first data bus 115. In the period T0, the switches S8-S0 and the switch S00 of the main switch group 108 are made contact to the side of the lower-limit reference voltage (VB), and the switch S9 is made connect to the side of the upper-limit reference voltage (VT). FIG. 5 is a circuit diagram schematically showing the circuit in such a state. Referring to FIG. 5, in the above operation, the lower-limit reference voltage (VB) is applied to a half of the capacitance of the main capacitance array 106, and the upper-limit reference voltage (VT) is applied to the remaining half of the capacitance.

At this time, an amount of electric charge Q2 stored in the main capacitance array 106 can be expressed by the following equation (2), provided that the voltage of the common connection node 110 of the capacitance arrays is VX.

$$Q2 = (1C \times 2^9) \times (VT - VX) + (1C \times 2^9) \times (VB - VX) \quad (2)$$

The electric charge amount Q1 stored in the main capacitance array 106 during the sampling period remains as it is. Thus, the voltage VX of the common connection node 110 of the capacitance arrays can be found by setting "Q1=Q2" from the equation (1) and the equation (2). The voltage is expressed by the following equation (3).

$$VX = \frac{(VT + VB)}{2} - Ain + VCOM \quad (3)$$

The voltage (VX) of the common connection node 110 of the capacitance arrays expressed by the equation (3) and the voltage (VCOM) of the common connection node 110 of the capacitance arrays during the sampling period TCG are detected by the voltage comparator 111. As the comparison result 113, the voltage comparator 111 outputs the logic value of "1" when the voltage (VCOM) of the common connection node 110 of the capacitance arrays during the sampling period TCG is larger, and outputs the logic value of "0" for an opposite case.

When the comparison result 113 indicates the logic value of "1", the successive approximation register SAR 114 keeps the logic value of "1" of the first bit (MSB) so as to keep the logic value of "1" for the data $D_9$ of the first data bus 115. For the opposite case, the first bit (MSB) is set to logic value of "0" so as to set the logic value of "0" for the data D₉ of the first data bus 115. Thus, in the operation, the comparing operation of the first bit (MSB) is ended.

Returning to FIG. 3 again, the successive approximation register SAR 114 sets the logic value of "1" of a second bit in a next period T1 so as to set the logic value of the data $D_8$ of the first data bus 115 to "1". The main switch control circuit 116 controls the main switch group 108 in accordance with the code of the first data bus 115. The main switch control circuit 116 switches the connections of the main switch group 108 so as to switch the voltage to be applied to each of the capacitance elements of the main capacitance array 106. Assuming that the comparison result of the first bit indicates the logic value of "1", the switch S8 of the main switch group 108 is made connect to the side of the upper-limit reference voltage (VT), while the switch S9 is kept connected to the side of the upper-limit reference voltage (VT). As in case of the comparing operation of the first bit, the amount of electric charge Q1 stored in the main capacitance array 106 during the sampling period is maintained. Thus, the voltage VX of the common connection node 110 of the capacitance arrays is a voltage that is expressed by the following equation (4).

$$VX = \frac{(VT+VB)}{2} + \frac{(VT+VB)}{4} - Ain + VCOM \qquad (4)$$

As in case of the comparing operation of the first bit, the voltage (VX) of the common connection node 110 of the capacitance arrays expressed by the equation (4) and the voltage (VCOM) of the common connection node 110 of the capacitance arrays during the sampling period TCG are compared by the voltage comparator 111. The successive approximation register SAR 114 determines the value of the second bit in accordance with the comparison result. A series of operations are repeated until the period T9. Data to the lowest bit (LSB) of the successive approximation register SAR 114 is outputted as the result of the A/D conversion of the analog input voltage signal Ain 101. After the period T9 has passed, the successive approximation register SAR 114 outputs an EOC 121 to indicate the end of A/D conversion. At this time, the trigger detecting circuit output signal 209 is in the low level, so that the result of the A/D conversion of the analog input voltage signal Ain 101 is outputted from the first buffer 118 as the A/D conversion result 119 in the form of a digital signal.

There is a case that the voltage comparator 111 includes an offset error. The A/D converter has a function of correcting the offset error to attain an accurate A/D conversion characteristic. Hereinafter, the A/D converting operation performed for detecting the offset error will be described with reference to a timing chart shown in FIG. 6.

Referring to FIG. 6, as in case of the basic A/D converting operation, the A/D converter performs the A/D converting operation during the sampling period TCG and the comparing periods T0-T5. The A/D converter starts the A/D converting operation in response to the calibration external trigger (instructing to start the A/D conversion for detecting the offset error) 133 to detect the offset error. Further, the voltage to be sampled is not the analog input voltage signal Ain but the analog ground voltage signal AGND. Furthermore, the D/A converter uses the correction capacitance array 107 together with the correction switch group 109 in the comparing periods.

When the calibration external trigger 133 is set to the high level, the A/D converter starts the A/D converting operation to detect the offset error. When the calibration external trigger 133 turns to the high level, the counter 201 starts a counting operation in response to the output of the OR circuit 203 at that time. The counter 201 outputs the TCG 122 in the high level in response to the start of the counting operation. The A/D converter performs sampling of the analog ground voltage signal AGND in response to the TCG 122 in the high level.

At this time, the second switch 112 is activated in response to the second buffer output signal 210. By the activation of the second switch 112, an input terminal and an output terminal of the amplifier 120 for the voltage comparator 111 are short-circuited. Thus, the voltage comparator 111 biases the voltage of the common connection node 110 of the capacitance arrays to a constant voltage (VCOM). Further, the first switch 105 connects the sample voltage supplying line 104 to the side of the analog ground voltage signal AGND in response to the second logic circuit output signal 213. Further, the main switch group 108 connects all the switches to the side of the sample voltage supplying line 104 in response to the third buffer output signal 211. Thus, all the capacitance elements of the main capacitance array 106 are charged to the analog ground voltage signal AGND.

At this time, the correction switch control circuit 117 outputs the correction switch control signal 123 to apply the constant voltage to the correction capacitance array 107. FIG. 7 is a circuit diagram showing a configuration of the main capacitance array 106 and the correction capacitance array 107 at that time. In FIG. 7, the upper-limit reference voltage (VT) is applied to a half of the capacitance of the correction capacitance array 107 and the lower-limit reference voltage (VB) is applied to the remaining half of the capacitance so as to set to an intermediate value of a correction range.

When the counting operation of a prescribed sampling period ends, the counter 201 outputs the TCG 122 in the low level. In accordance with the second buffer output signal 210 and the second logic circuit output signal 213 outputted in response to the TCG 122 in the low level, the second switch 112 and the first switch 105 are turned OFF. At this time, the voltage of the common connection node 110 of the capacitance arrays turns to a high-impedance state. Thus, the electric charges that are stored in all the capacitance elements of the main capacitance array 106 and the correction capacitance array 107 remain as it is.

Thereafter, the correction switch control circuit 117 applies to each of the capacitance elements of the main capacitance array 106, the voltage corresponding to the code (theoretical value) indicating the analog ground voltage signal AGND in the period T0. Further, the successive approximation register SAR 114 sets the logic value of the first bit to "1". Here, the correction capacitance array 107 is used in the comparing period of the A/D converting operation to detect the offset error. The correction capacitance array 107 is of 6 bits. Thus, the successive approximation register SAR 114 functions as a 6-bit register. FIG. 8 shows a circuit diagram schematically showing the configuration.

The first bit of the successive approximation register SAR 114 corresponds to the data $D_5$ that is supplied via the first data bus 115. By setting the logic value of the first bit of the successive approximation register SAR 114 to "1", the logic value of the data $D_5$ is set to "1". The latch circuit 140 outputs the data, which is supplied via the first data bus 115, to the second data bus 141 as it is. The correction switch control circuit 117 controls the correction switch group 109 based on the code supplied via the second data bus 141. The correction switch group 109 changes the voltage to be applied to each of the capacitance elements of the correction capacitance array 107 in response to the correction switch control signal 123 outputted from the correction switch control circuit 117.

Thus, when the voltage of the common connection node 110 of the capacitance arrays changes, the voltage comparator 111 compares the voltage after the change and the voltage of the common connection node 110 of the capacitance arrays during the sampling period TCG. The voltage comparator 111 outputs the comparison result 113 to indicate the logic value of "1", when the voltage of the common connection node 110 of the capacitance arrays during the sampling period TCG is higher. Meanwhile, the voltage comparator 111 outputs the comparison result 113 to indicate the logic value of "0" for the opposite case. When the logic value of the comparison result 113 is "1", the successive approximation register SAR 114 keeps the logic value of the first bit to be "1". When the logic value of the comparison result 113 is "0", the successive approximation register SAR 114 changes the logic value of the first bit to "0".

The same operation is repeated in the same manner from the period T1 to the period T5. The data from the successive approximation register 114 to the lowest bit (LSB) is the offset error data. After the period T5 has passed, the successive approximation register SAR 114 outputs an EOC 121. At this time, the trigger detecting circuit output signal 209 is in the high level, so that the successive approximation register SAR 114 stores the error data in the latch circuit 140 as the correction data.

Next, an A/D conversion operation for correcting the offset error will be described with reference to a timing chart shown in FIG. 9. As in case of the basic A/D converting operation, the operation for correcting the offset error is performed during the sampling period TCG and the comparing periods T0-T9, in which the offset error is corrected based on the detected offset error data.

The A/D converting operation is started by setting the A/D trigger (instructing to start the A/D conversion for detecting the offset error) 132 to the high level. When the calibration external trigger (instructing to start the A/D conversion for detecting the offset error) 133 turns to the high level, the counter 201 starts a counting operation in response to the output of the OR circuit 203 at that time. The counter 201 outputs the TCG 122 in the high level in response to the start of the counting operation. The counter 201 continues to output the TCG 122 in the high level, until the counting operation of the sampling period is ended. The A/D converter performs sampling of the analog ground voltage signal AGND in response to the TCG 122 in the high level.

The second switch 112 is activated in response to the second buffer output signal 210. Thus, the voltage comparator 111 biases the voltage of the common connection node 110 of the capacitance arrays to a constant voltage VCOM. Further, the first switch 105 connects the analog input voltage signal Ain 101 to the sample voltage supplying line 104 in response to the first logic circuit output signal 212. All of the switches of the main switch group 108 connect the sample voltage supplying line 104 to the main capacitance array 106 in response to the third buffer output signal 211. All the capacitance elements of the main capacitance array 106 are charged to the analog input voltage signal Ain. At this time, the same constant voltage as the voltage applied at the time of offset error detection is applied to the correction capacitance array 107.

FIG. 10 is a circuit diagram schematically showing a configuration of the circuit in such a state. For example, the upper-limit reference voltage (VT) is applied to a half of the capacitance of the correction capacitance array 107 and the lower-limit reference voltage (VB) is applied to the remaining half of the capacitance thereof so as to set to an intermediate value (the intermediate value "32" in case of FIG. 1, since the correction capacitance array 107 is of 6 bits) of a correction range.

When the counting operation during a prescribed sampling period ends, the counter 201 sets the TCG 122 to the low level. In response to the TCG 122 in the low level, the second switch 112 and the first switch 105 are inactivated. At this time, the voltage of the common connection node 110 of the capacitance arrays turns to a high-impedance state. Thus, the electric charges that are stored in all the capacitance elements of the main capacitance array 106 and the correction capacitance array 107 are kept. An amount of electric charge Q3 stored at this point can be expressed by the following equation (5).

$$Q3=(1C\times2^{10})\times(Ain-VCOM)+(1C\times2^5)\times(VT-VCOM)+(1C\times2^5)\times(VB-VCOM) \quad (5)$$

Thereafter, the control circuit 134 applies the voltage to the correction capacitance array 107 in accordance with the offset error stored in the latch circuit 140 in the comparing periods T0-T9. Assuming that the correction code of the offset error is the voltage for 40 LSB (the actual correction amount is the voltage for 8 LSB, which is obtained by subtracting the intermediate value set during the sampling period TCG (40 LSB−32 LSB=8 LSB)), the correction switch control circuit 117 applies the upper-limit reference voltage (VT) to the capacitance element $CC_5$ corresponding to $2^5$ times of the unit capacitance element and the capacitance element $CC_3$ corresponding to $2^3$ times of the unit capacitance element, and applies the lower-limit reference voltage (VB) to the remaining capacitance elements.

Further, the control circuit 134 sets the logic value of the first bit (MSB) of the successive approximation register SAR 114 in the period T0 to "1" so as to set the logic value of the data $D_9$ of the first data bus 115 to "1". In accordance with the code of the first data bus 115, the main switch control circuit 116 controls the main switch group 108. The voltages to be applied to the respective capacitance elements of the main capacitance array 106 are changed by changing the connections of the main switch group 108.

In the period T0, the switches S8-S00 of the main switch group 108 are connected to the side of the lower-limit reference voltage (VB), and the switch S9 is connected to the side of the upper-limit reference voltage (VT). FIG. 11 is a circuit diagram schematically showing the circuit in such a state. Referring to FIG. 11, the lower-limit reference voltage (VB) is applied to a half of the capacitance of the main capacitance array 106, and the upper-limit reference voltage (VT) is applied to the remaining half of the capacitance.

At this time, an amount of electric charge Q4 stored in the main capacitance array 106 and the correction capacitance array 107 can be expressed by the following equation (6), provided that the voltage of the common connection node 110 of the capacitance arrays is VX.

$$Q4=(1C\times2^9)\times(VT-VX)+(1C\times2^9)\times(VB-VX)+\{1C\times(2^5+2^3)\}\times(VT-VX)+\{1C\times(2^0+2^0+2^1+2^2+2^4)\}\times(VB-VX) \quad (6)$$

The amount of electric charge Q3 stored in the main capacitance array 106 and the correction capacitance array 107 during the sampling period remains as it is. Thus, the voltage (VX) of the common connection node 110 of the capacitance arrays can be found by setting "Q3=Q4" from the equation (5) and the equation (6), and the voltage is expressed by the following equation (7).

$$VX = \left(\frac{2^{10}}{2^{10}+2^6}\right) \times \left(\frac{VT+VB}{2} - Ain + 8LSB\right) + VCOM \quad (7)$$

As in the equation (7), it can be found that the voltage for the correction data (8 LSB) of the offset error has being corrected. The voltage (VX) of the common connection node 110 of the capacitance arrays expressed by the equation (7) and the voltage (VCOM) of the common connection node 110 of the capacitance arrays during the sampling period TCG are compared by the voltage comparator 111. The voltage comparator 111 outputs the logic value of "1" as the comparison result 113 when the voltage (VCOM) of the common connection node 110 of the capacitance arrays during the sampling period TCG is higher, and outputs the logic value of "0" as the comparison result 113 for the opposite case.

When the logic value of the comparison result 113 is "1", the successive approximation register SAR 114 keeps the logic value of the first bit (MSB) to be "1" so as to keep the logic value of "1" for the data $D_9$ of the first data bus 115. For the opposite case, the first bit (MSB) is set to the logic value of "0" so as to set the logic value of "0" for the data Dg of the first data bus 115. Thus, in this operation, the comparing operation of the first bit (MSB) is ended.

The operation in the period T1 and the subsequent is the same as the basic A/D converting operation. The data to the lowest bit (LSB) of the successive approximation register SAR 114 is obtained as the result of the A/D conversion on the analog input signal Ain, and it is outputted as the A/D conversion result 119 with the offset error being corrected.

However, there is a limit in a voltage range that can be corrected by the correction capacitance elements. Thus, in order to extend the correctable voltage range, it is necessary to increase the correction capacitance elements. However, this causes an increase in a core size for the increase in the correction capacitance elements.

SUMMARY

In an aspect of the present invention, a successive approximation type A/D converter includes: a main capacitance array connected with a common connection node; a correction capacitance array; a voltage comparator configured to detect a voltage of said common connection node; a successive approximation register in which a value is set based on an output of said voltage comparator; a first control circuit configured to change a voltage applied to capacitance elements of said main capacitance array and said correction capacitance array based on a value set in said successive approximation register; and a second control circuit configured to respond to a control signal to connect said main capacitance array to an input voltage signal or a first predetermined voltage, and said correction capacitance array to said common connection node or a second predetermined voltage.

According to the present invention, it is possible to supply to the common electrode of the correction capacitance array, a voltage that is different from that of the common electrode of the main capacitance array during the sampling period, by providing a switch between the common electrode of the correction capacitance array and the common electrode of the main capacitance array. Therefore, it is possible to expand the range of the voltages that can be corrected by the correction capacitance array.

BRIEF DESCRIPTION OF THE DRAWINGS

The above and other objects, advantages and features of the present invention will be more apparent from the following description of certain preferred modes taken in conjunction with the accompanying drawings, in which.

DESCRIPTION OF THE PREFERRED EMBODIMENTS

Hereinafter, a successive approximation type A/D (analog-to-digital) converter according to the present invention will be described in detail with reference to the attached drawings.

First Embodiment

Figure 1:
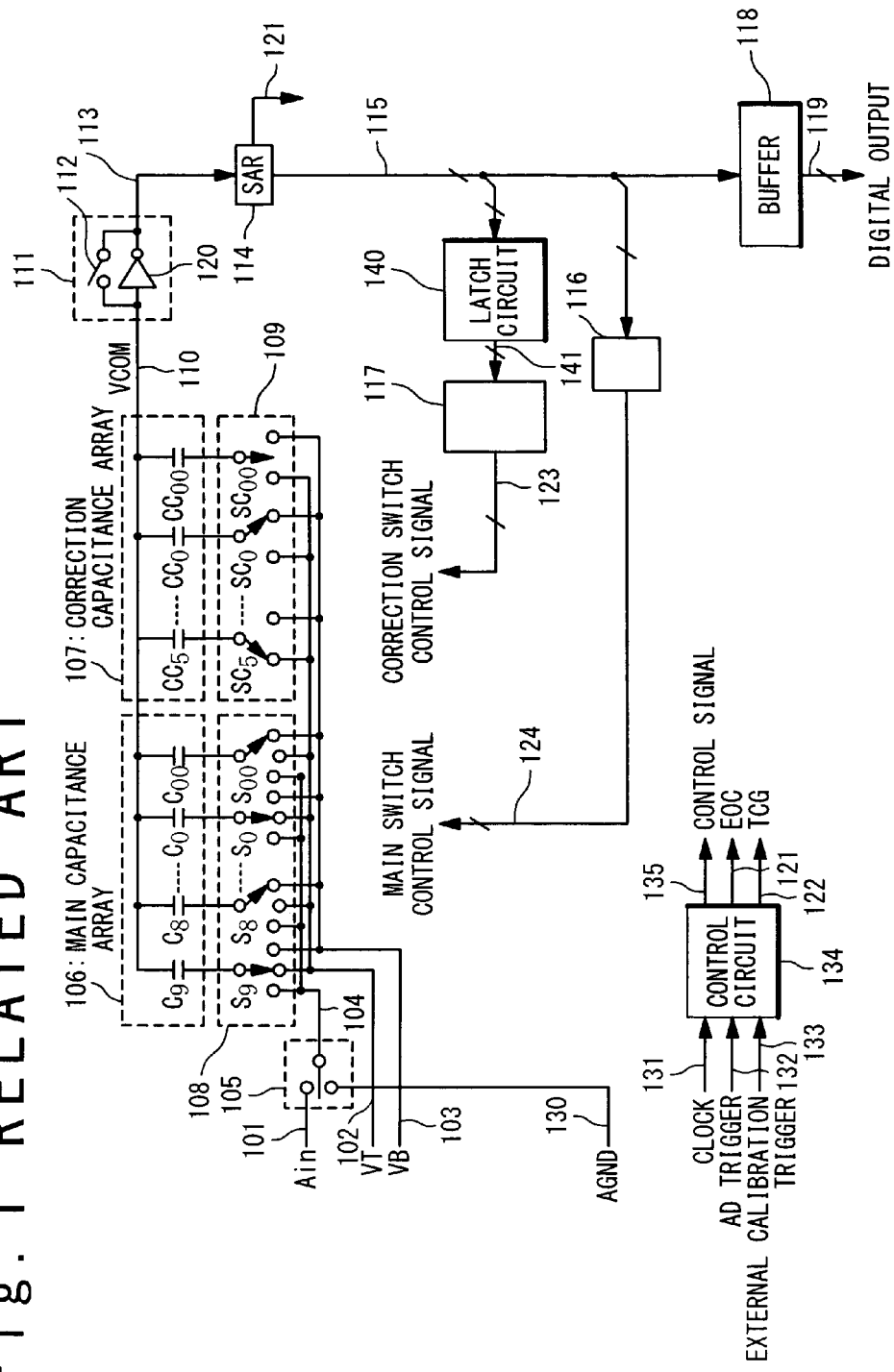
FIG. 1 is a circuit block diagram showing a configuration of an A/D converter.
Figure 2:
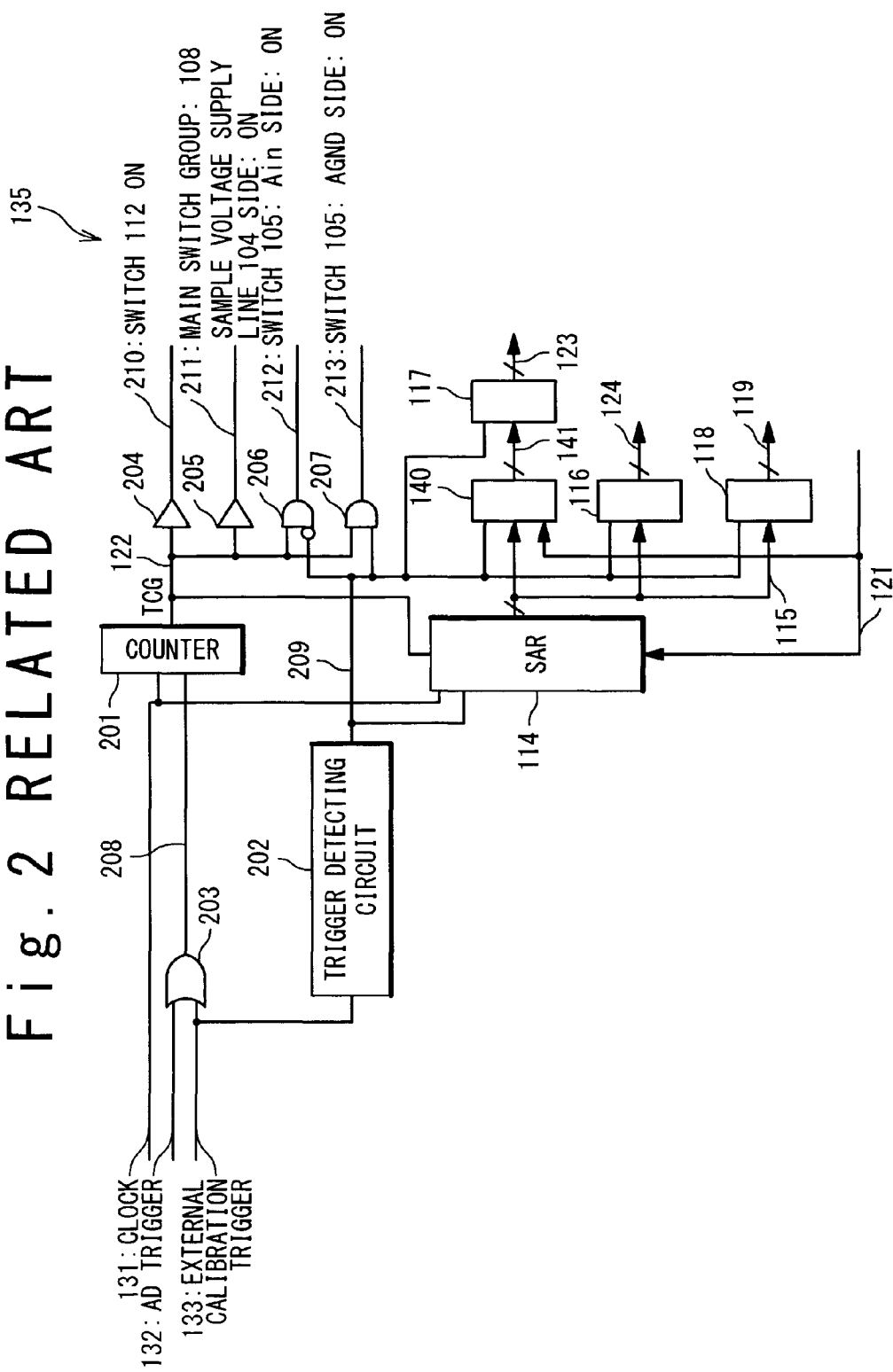
FIG. 2 is a circuit diagram showing configurations of a control circuit and control signals in the A/D converter.
Figure 3:
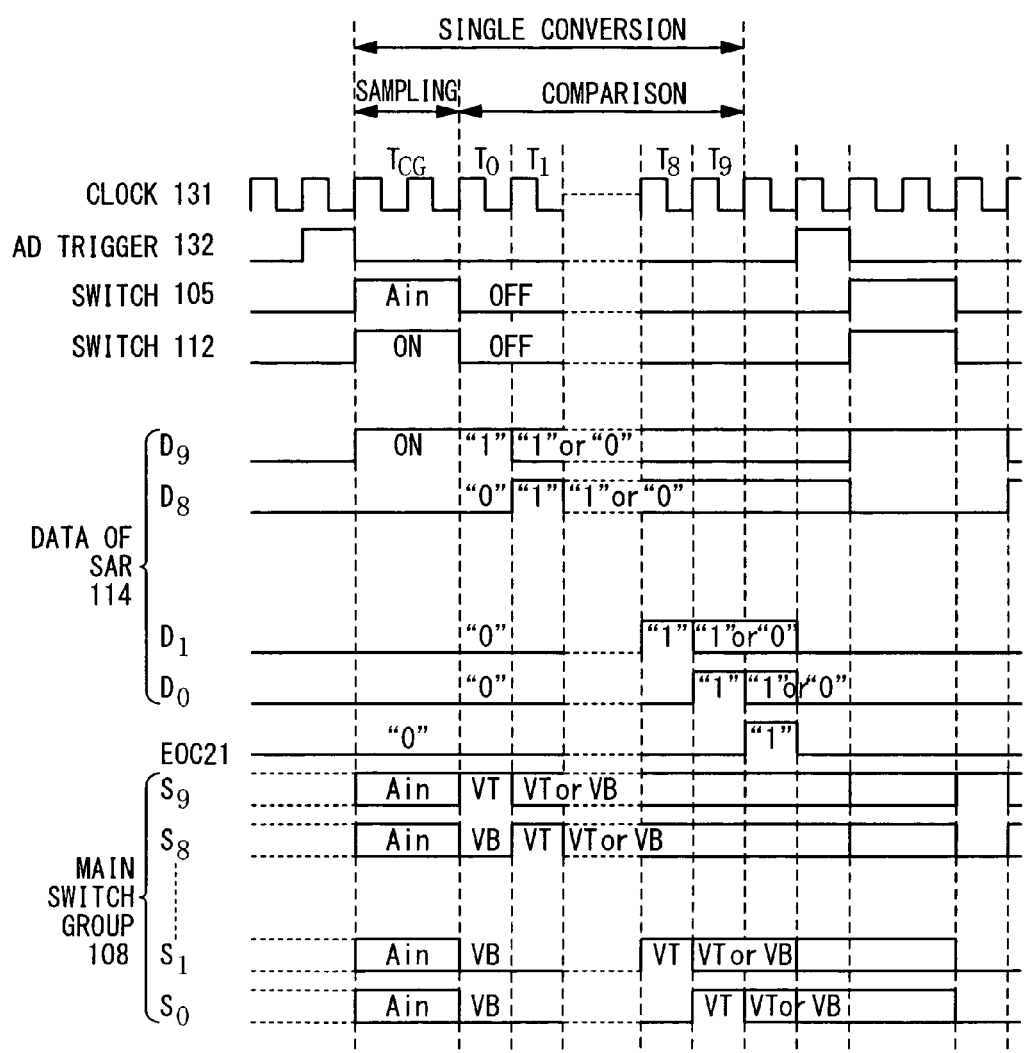
FIG. 3 shows timing charts of an operation of the A/D converter.
Figure 4:
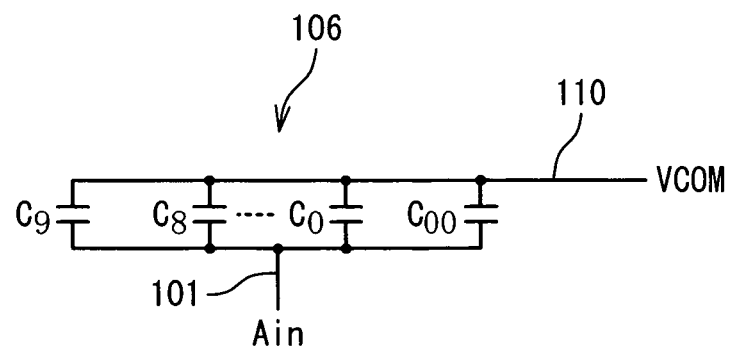
FIGS. 4 and 5 are schematic diagrams showing connection states of a main capacitance array in the A/D converter.
Figure 5:
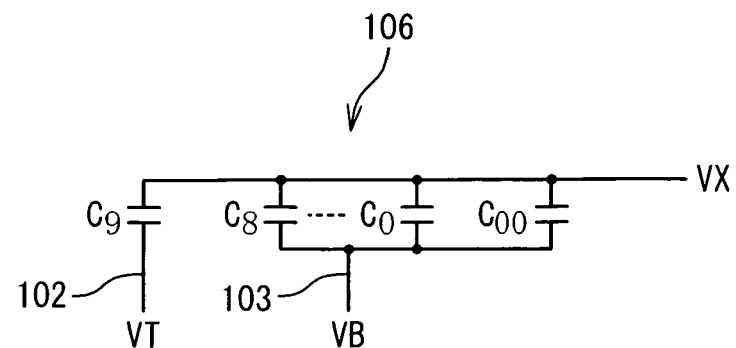
Figure 6:
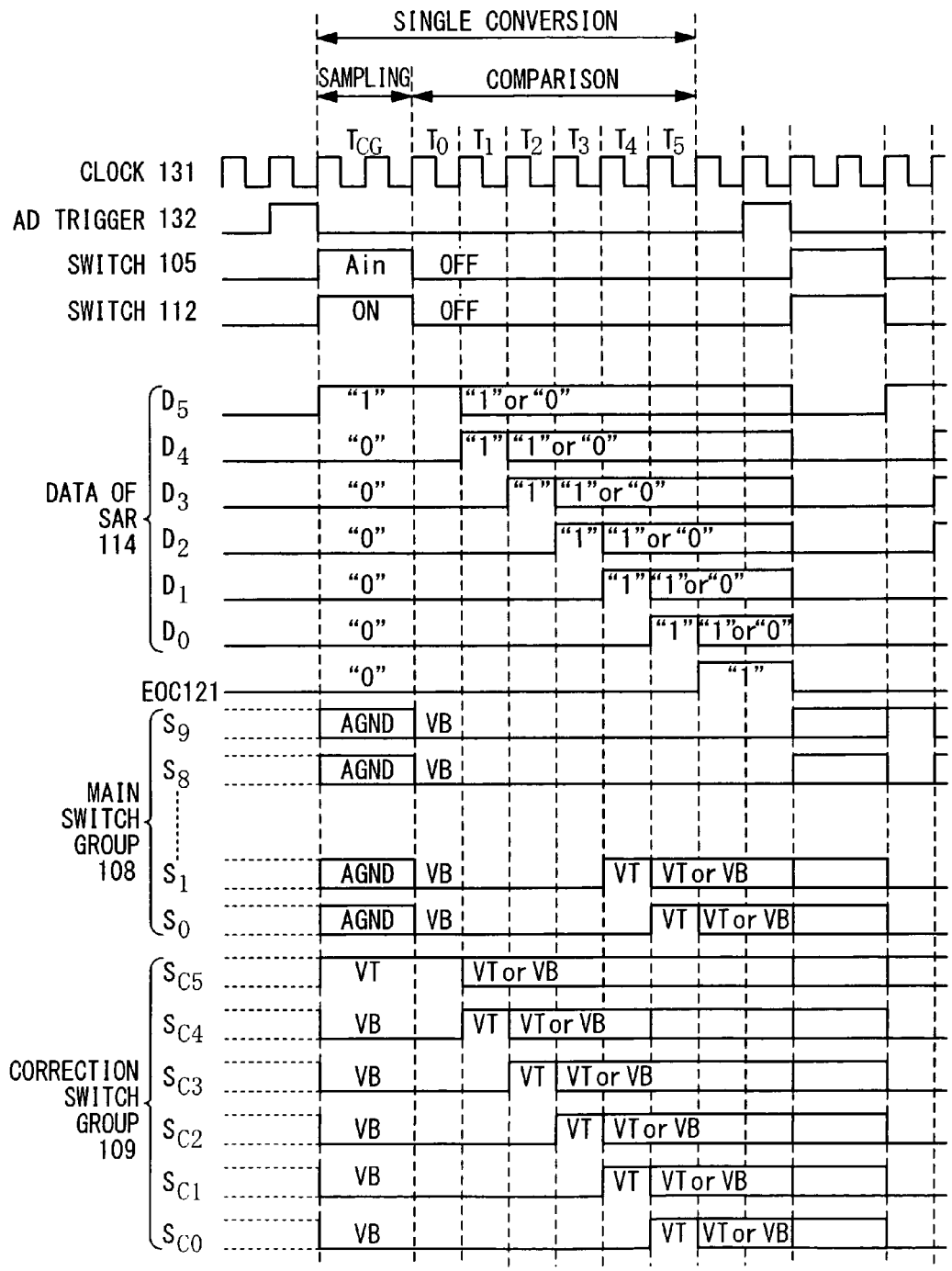
FIG. 6 shows timing charts of an A/D converting operation for detecting an offset error in the A/D converter.
Figure 7:
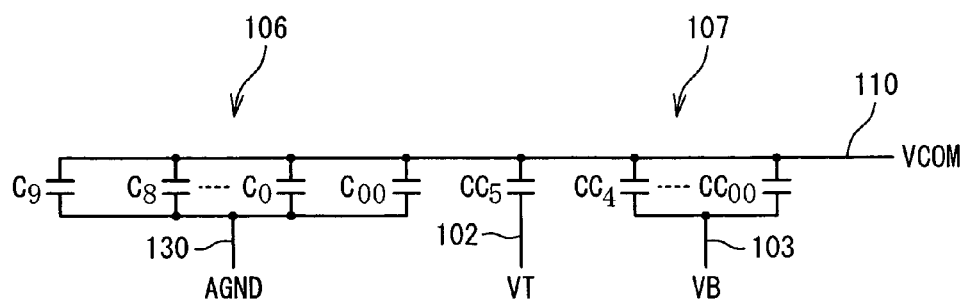
FIGS. 7 and 8 are schematic diagrams showing connection states of the main capacitance array and a correction capacitance array in the A/D converter.
Figure 8:
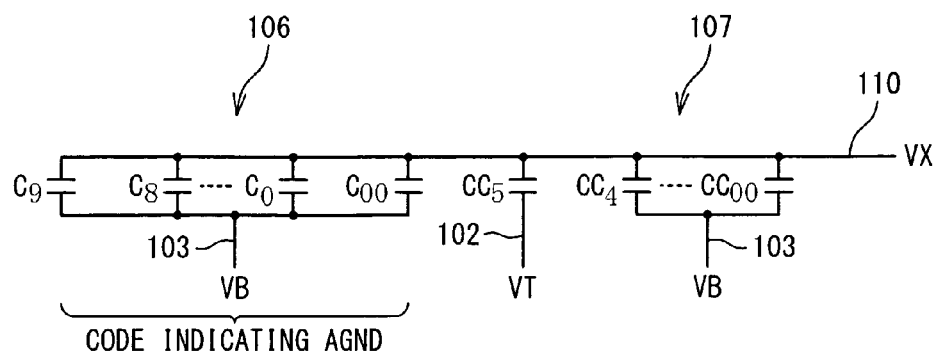
Figure 9:
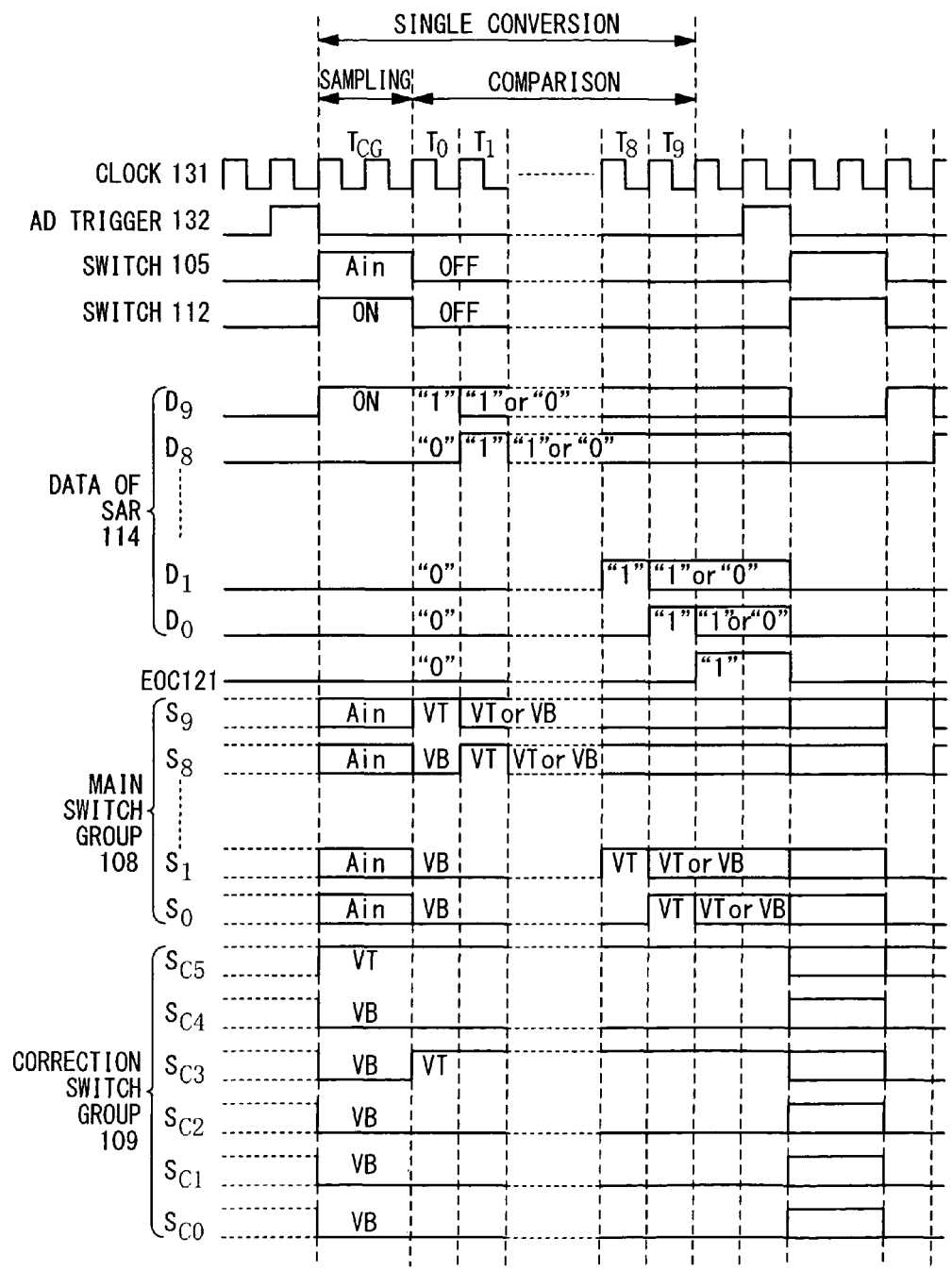
FIG. 9 shows timing charts of the A/D converting operation in the A/D converter.
Figure 10:
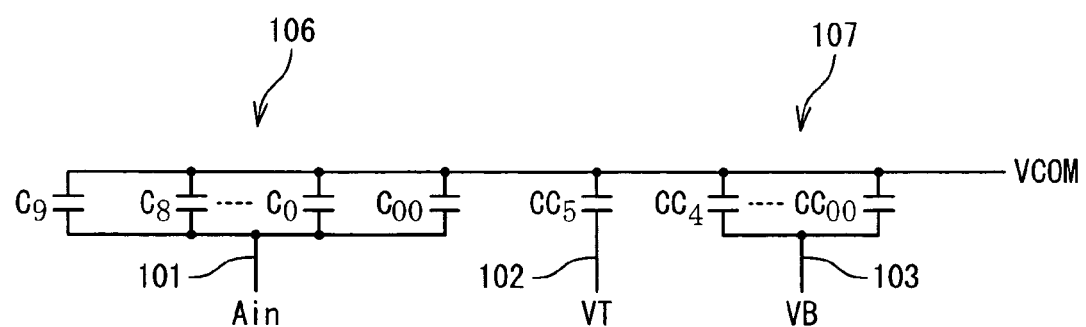
FIGS. 10 and 11 are schematic diagrams showing connection states of the main capacitance array and a correction capacitance array in the A/D converter.
Figure 11:
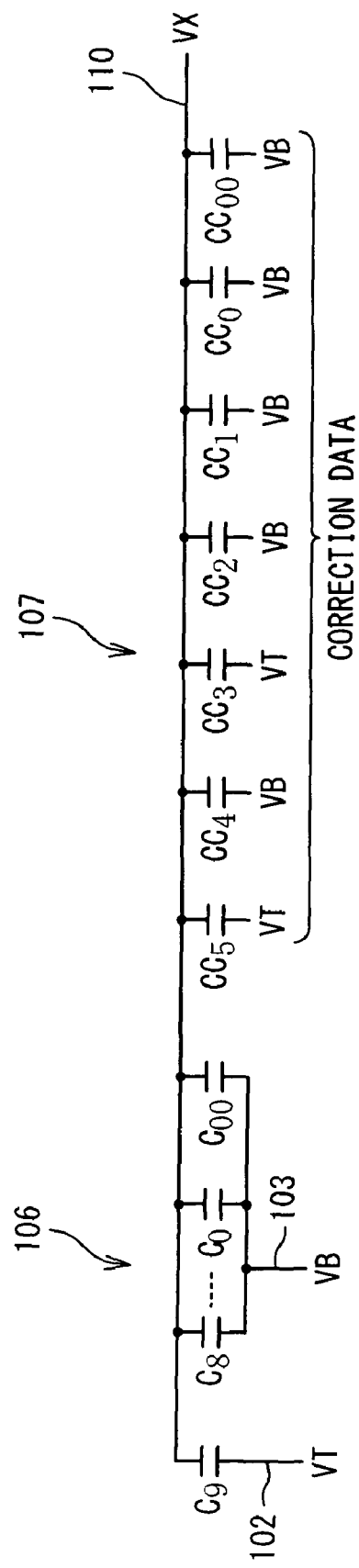
Figure 12:
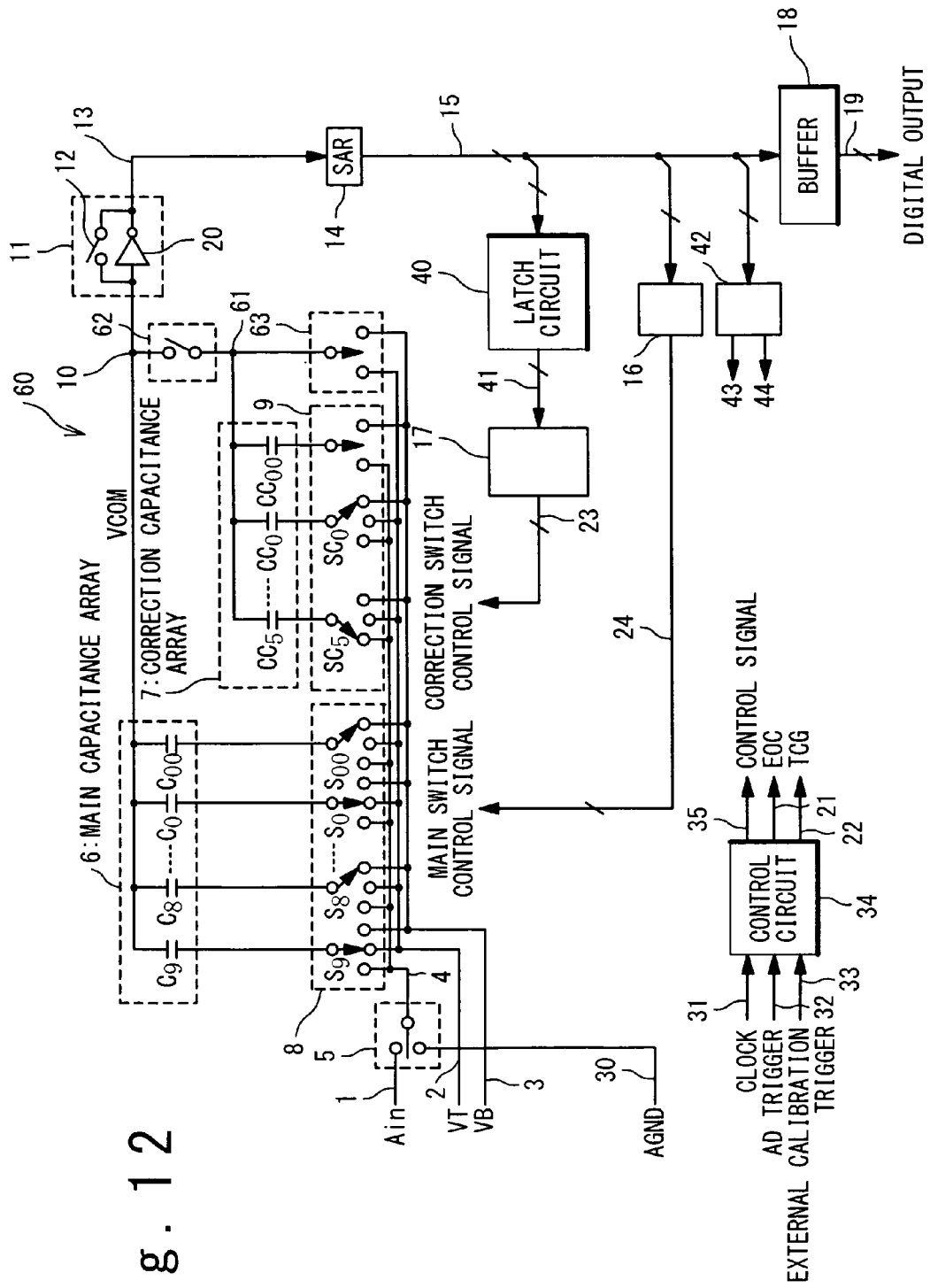
FIG. 12 is a circuit block diagram showing a configuration of a successive approximation type A/D converter according to a first embodiment of the present invention.

FIG. 12 is a circuit diagram showing a configuration of a successive approximation type A/D converter 60 according to a first embodiment of the present invention. In the following description, the successive approximation type A/D converter 60 in the first embodiment has 10-bit resolution realized by a 10-bit capacitance array. Referring to FIG. 12, the successive approximation type A/D converter 60 includes an analog input voltage supplying line 1, an upper-limit reference voltage supplying line 2, a lower-limit reference voltage supplying line 3, an analog ground line 30, a sample voltage supplying line 4, a first switch 5, a main capacitance array 6, a correction capacitance array 7, a main switch group 8, a correction switch group 9, a voltage comparator 11, a successive approximation register SAR 14, a first data bus 15, a main switch control circuit 16, an A/D conversion result output buffer 18, a latch circuit 40, a correction switch control circuit 17, and a correction data determining circuit 42.

The analog input voltage supplying line 1 receives an analog input voltage signal Ain, and supplies it to the first switch 5. The analog ground line 30 receives an analog ground voltage signal AGND, and supplies it to the first switch 5. The upper-limit reference voltage supplying line 2 supplies an upper-limit reference voltage VT to the successive approximation type A/D converter 60. The lower-limit reference voltage supplying line 3 supplies a lower-limit reference voltage VB to the successive approximation type A/D converter 60. The sample voltage supplying line 4 supplies a voltage selected by the first switch 5 into the successive approximation type A/D converter 60. The first switch selects either the analog input voltage signal Ain supplied from the analog input voltage supplying line 1 or the analog ground voltage signal AGND supplied via the analog ground line 30, and supplies the selected voltage to the sample voltage supplying line 4.

The main capacitance array 6 includes a plurality of capacitance elements. The plurality of capacitance elements of the main capacitance array 6 are connected in parallel. One end of each capacitance element is connected to a first common connection node 10. The main switch group 8 includes a plurality of switches that are respectively connected to the plurality of capacitance elements of the main capacitance array 6. The correction capacitance array 7 includes a plurality of correction capacitance elements. The correction switch group 9 includes a plurality of correction switches that are respectively connected to the plurality of correction capacitance elements of the correction capacitance array 7.

The voltage comparator 11 includes a feedback switch 12 and an amplifier 20. The amplifier 20 amplifies an input signal. An input terminal of the amplifier 20 is connected to the first common connection node 10. The feedback switch 12 connects an output terminal of the amplifier 20 to the input terminal thereof in response to a control signal. Further, the voltage comparator 11 supplies a voltage comparator output 13 to the successive approximation register SAR 14. The first data bus 15 supplies the data held in the successive approximation register SAR 14 to the main switch control circuit 16, the latch circuit 40, the A/D conversion result output buffer 18, and the correction data determining circuit 42. The main switch control circuit 16 outputs a main switch group control signal 24 based on the data supplied via the first data bus 15. The A/D conversion result output buffer 18 outputs an A/D conversion result 19 as a final A/D conversion result. The latch circuit 40 stores the data supplied via the first data bus 15. A second data bus 41 supplies the data latched by the latch circuit 40 to the correction switch control circuit 17. The correction switch control circuit 17 outputs a correction switch group control signal 23 based on the data latched by the latch circuit 40. The correction data determining circuit 42 determines whether the correction data supplied via the first data bus 15 is zero-code, full-code, or other code. The correction data determining circuit 42 outputs a full-code signal 43, when the correction data is full-code. Also, the correction data determining circuit 42 outputs a zero-code signal 44, when the correction data is zero-code.

Here, the successive approximation type A/D converter 60 of the first embodiment includes a node connection switch 62 and a reference voltage switch 63. One end of the node connection switch 62 is connected to the reference voltage switch 63 via a second common connection node 61. The other end of the node connection switch 62 is connected to the first common connection node 10. The successive approximation type A/D converter 60 is capable of setting the voltage of the second common connection node 61 to a different voltage from voltage of the first common connection node 10 during a sampling period. As shown in FIG. 12, the successive approximation type A/D converter 60 can select either the upper-limit reference voltage VT or the lower-limit reference voltage VB through the reference voltage switch 63. Furthermore, the successive approximation type A/D converter 60 can also select the voltage of the first common connection node 10 by the node connection switch 62. Therefore, the voltage selected from three kinds of voltages is supplied to the first common connection node 10 of the successive approximation type A/D converter 60.

Further, the successive approximation type A/D converter 60 operates based on control signals outputted from a control circuit 34. The control circuit 34 controls the main switch control circuit 16, the correction switch control circuit 17, the latch circuit 40, the voltage comparator 11, the successive approximation register SAR 14, the A/D conversion result output buffer 18, the node connection switch 62, and the reference voltage switch 63.

An operation clock signal 31, an A/D trigger 32, and an external calibration trigger 33 are supplied to the control circuit 34. The operation clock signal 31 is a clock signal for operating the control circuit 34. The A/D trigger 32 is a control signal to start the A/D conversion. The external calibration trigger 33 is a control signal to start the A/D conversion for detecting an offset error. The control circuit 34 outputs an A/D conversion end signal EOC 21, a sampling period signal TCG 22, and a control signal 35. The A/D conversion end signal EOC 21 indicates the end of the A/D conversion EOC. The sampling period signal TCG 22 indicates a sampling period. The control signal 35 is used for controlling the main switch control circuit 16, the correction switch control circuit 17, the latch circuit 40, the voltage comparator 11, the successive approximation register SAR 14, the A/D conversion result output buffer 18, the node connection switch 62, and the reference voltage switch 63.

An internal D/A converter of the successive approximation type A/D converter 60 includes the main capacitance array 6. The main capacitance array 6 includes 11 binary-weighted capacitance elements. That is, the main capacitance array 6 includes capacitance elements $C_{00}$ and $C_0$ having a capacitance value (1C) for a unit capacitance element, a capacitance element $C_1$ having a capacitance value of $2^1$ times of the unit capacitance element, and also capacitance elements of $C_2$-$C_9$ having capacitance values of $2^2$ times to $2^9$ times of the unit capacitance element. Further, the successive approximation type A/D converter 60 also includes an internal correction D/A converter. The internal correction D/A converter includes the correction capacitance array 7. The correction capacitance array 7 includes 6 binary-weighted capacitance elements. That is, the correction capacitance array 7 includes capacitance elements $CC_{00}$ and $CC_0$ having a capacitance value (1C) of the unit capacitance element, a capacitance element $CC_1$ having a capacitance value of $2^1$ times of the unit capacitance element, and also capacitance elements of $CC_2$-$CC_5$ having capacitance values of $2^2$ times to $2^5$ times of the unit capacitance element. Therefore, the successive approximation type A/D converter 60 can execute correction of an offset error in 6-bit resolution.

Figure 13:
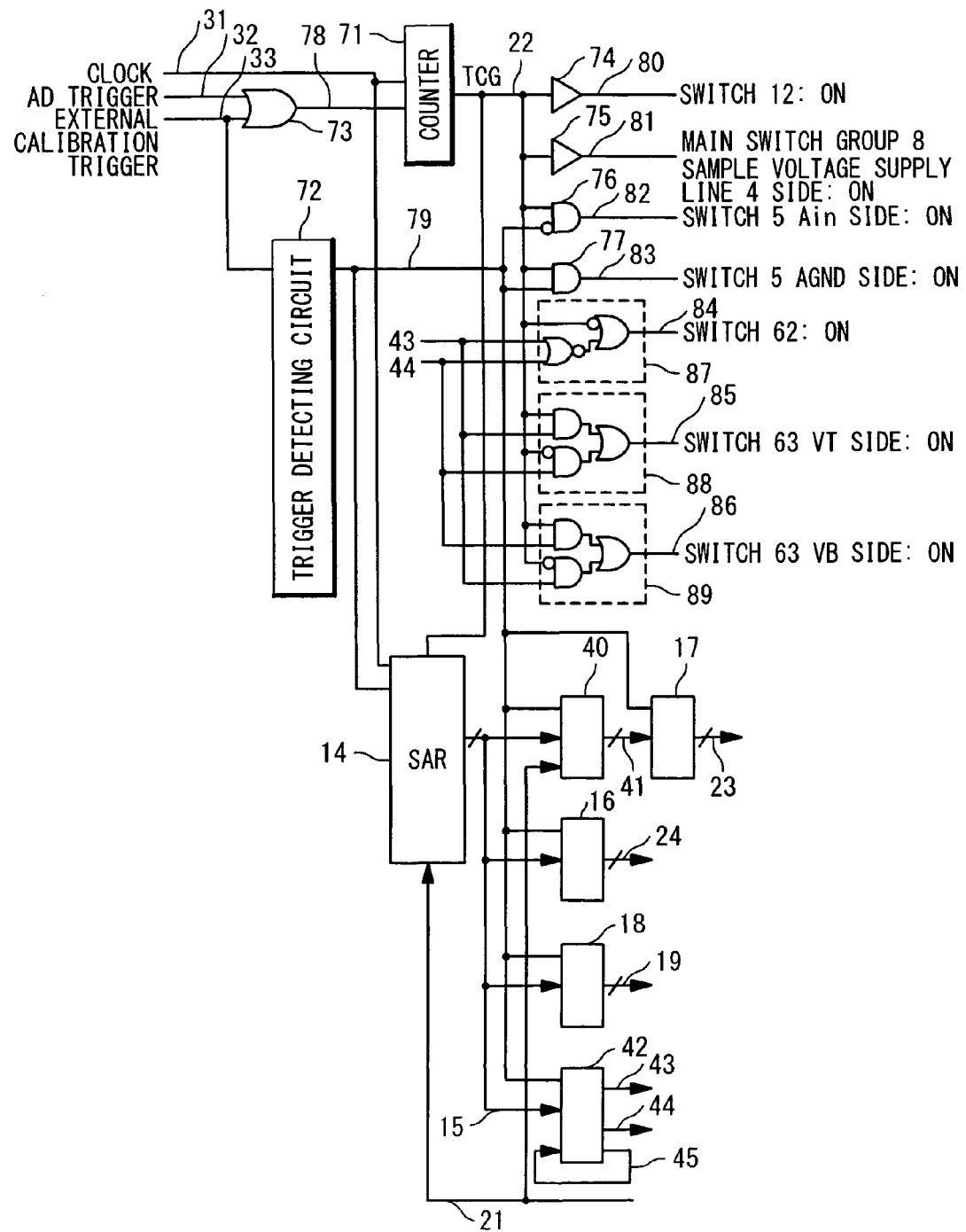
FIG. 13 is a circuit block diagram showing a configuration of a control circuit in the successive approximation type A/D converter according to the first embodiment of the present invention.

Here, the above control circuit 34 and the control signal 35 will be described with reference to the drawings. FIG. 13 is a circuit block diagram showing the configuration of the control circuit 34. A counter 71 counts the sampling period. The counter 71 starts a counting operation in response to an operation clock signal 31, when a first logic circuit output signal 78 is in a high level. Further, when a trigger detecting circuit 72 detects that a calibration external trigger 33 has been set to the high level, the trigger detecting circuit 72 outputs a trigger detecting circuit output signal 79. A first logic (OR) circuit 73 outputs the first logic circuit output signal 78 in the high level, when either the A/D trigger 32 or the calibration external trigger 33 is in the high level.

A first buffer 74 buffers and outputs a first control signal 80 to the feedback switch 12. The feedback switch 12 is activated during the sampling period in response to the first control signal 80. A second buffer 75 buffers and outputs a second control signal 81 to the main switch group 8. A plurality of switches of the main switch group 8 connect capacitance elements of the main capacitance array 6 to the sample voltage supplying line 4 during the sampling period in response to the second control signal 81. A second logic circuit 76 outputs a third control signal 82 to the first switch 5. The first switch 5 connects the analog input voltage supplying line 1 to the sample voltage supplying line 4 during the sampling period in response to the third control signal 82. A third logic circuit 77 outputs a fourth control signal 83 to the first switch 5. The first switch 5 connects the analog input voltage supplying line 1 to the analog ground line 30 in response to the fourth control signal 83. A fourth logic circuit 87 outputs a fifth control signal 84 to the node connection switch 62. The node connection switch 62 is activated in response to a fifth control signal 84. A fifth logic circuit 88 outputs a sixth control signal 85 to the reference voltage switch 63. The reference voltage switch 63 connects the second common connection node 61 to the upper-limit reference voltage supplying line 2 in response to the sixth control signal 85. A sixth logic circuit 89 outputs a seventh control signal 86 to the reference voltage switch 63. The reference voltage switch 63 connects the second common connection node 61 to the lower-limit reference voltage supplying line 3 in response to the seventh control signal 86.

The trigger detecting circuit output signal 79 is supplied to the second logic circuit 76 and the third logic circuit 77. The control circuit 34 controls the first switch 5 in accordance with the output of the second logic circuit 76 and the output of the third logic circuit 77. The first switch 5 switches the connection of the sample voltage supplying line 4 to one of an analog input voltage signal Ain 1 and an analog ground voltage signal AGND 30 in response to the third control signal 82 or the fourth control signal 83.

Further, the trigger detecting circuit output signal 79 is supplied to the latch circuit 40, the main switch control circuit 16, the correction switch control circuit 17, and the A/D conversion result output buffer 18. The control circuit 34 controls whether or not to use the data outputted from the successive approximation register SAR 14 onto the first data bus 15 in the main switch control circuit 16, based on the trigger detecting circuit output signal 79. Further, the control circuit 34 controls whether or not to use the data on the first data bus 15 in the correction switch control circuit 17, based on the trigger detecting circuit output signal 79. Furthermore, the control circuit 34 controls whether or not to output the data outputted from the A/D conversion result output buffer 18 onto the first data bus 15 as the A/D conversion result 19, based on the trigger detecting circuit output signal 79. Moreover, the control circuit 34 controls whether or not to store the data on the first data bus 15 in the latch circuit 40, based on the trigger detecting circuit output signal 79. Further, the trigger detecting circuit output signal 79 is supplied to the correction data determining circuit 42. The correction data determining circuit 42 determines whether the offset correction data (on the first data bus 15) obtained through the offset error detecting operation is zero-code, full-code, or other code based on the trigger detecting circuit output signal 79. The correction data determining circuit 42 outputs the full-code signal 43 in the high level, when the offset error data is full-code. Further, the correction data determining circuit 42 outputs the zero-code signal 44 in the high level, when the offset error data is zero-code. Furthermore, the correction data determining circuit 42 outputs a loop signal 45 in the high level, when the offset error data is zero-code or full-code. When the loop signal 45 is in the high level, the correction data determining circuit 42 does not perform a determining operation, and the levels of the full-code signal 43 and the zero-code signal 44 are held.

Hereinafter, an operation of the successive approximation type A/D converter 60 in the first embodiment will be described. The successive approximation type A/D converter 60 can separate the correction capacitance array 7 by the node connection switch 62 when performing a basic A/D converting operation in which an offset error is not taken into consideration. In the A/D converting operation for detecting the offset error, correction of the offset may be insufficient when an offset error found by the offset error detection is zero-code (for example, "000000" in the binary notation in case of 6-bits) or full-code (for example, "111111" in the binary notation in case of 6-bits). In such a case, the successive approximation type A/D converter 60 in the first embodiment performs a second-time offset error detecting operation to be described hereinafter. Through this operation, it is possible to detect the offset error in a wider range.

The correction data determining circuit 42 outputs a full-code signal 43 in the high level, when the offset error is full-code. Further, the correction data determining circuit 42 outputs a zero-code signal 44 in the high level, when the offset error is zero-code. The correction data determining circuit 42 sets the full-code signal 43 and the zero-code signal 44 to the low level and outputs those signals, when the offset error is neither zero-code nor full-code.

The A/D converting operation for the second-time offset error detection is started by setting the calibration external trigger 33 to the high level. When the calibration external trigger 33 is set to the high level, the counter 71 outputs the sampling period signal TCG 22 in the high level. The successive approximation type A/D converter 60 performs sampling of the analog ground voltage signal AGND in response to the calibration external trigger 33 in the high level. Specifically, at this time, the feedback switch 12 is activated in response to the first control signal 80. Because the feedback switch 12 is closed, the first common connection node 10 is biased to a constant voltage (VCOM). The first switch 5 connects the sample voltage supplying line 4 to the analog ground line 30 in response to the fourth control signal 83. All the switches of the main switch group 8 connect the main capacitance array 6 to the sample voltage supplying line 4 in response to the second control signal 81. Thus, all the capacitance elements of the main capacitance array 6 are charged to the analog ground voltage signal AGND.

Figure 14:
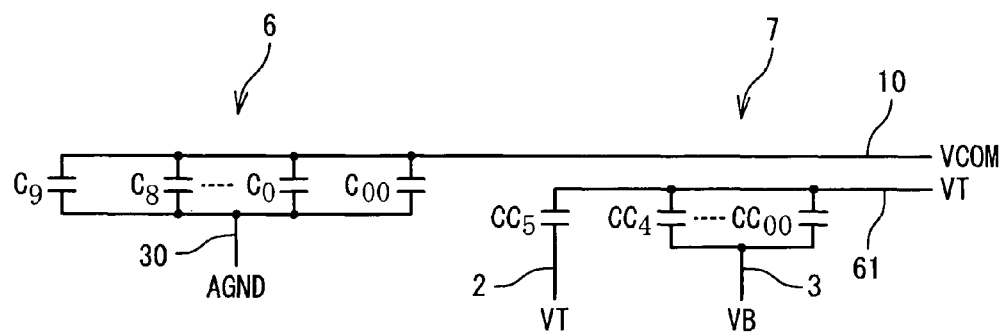
FIGS. 14 to 16 are schematic diagrams showing connection states in the successive approximation type A/D converter according to the first embodiment of the present invention.

Here, since the node connection switch 62 is in an open state, the second common connection node 61 is not connected to the first common connection node 10. At this time, when the full-code signal 43 is in the high level (when the offset error is full-code in the first-time offset error detection), the reference voltage switch 63 connects the second common connection node 61 to the upper-limit reference voltage supplying line 2 in response to the sixth control signal 85. Thus, the voltage of the second common connection node 61 becomes equivalent to the upper-limit reference voltage VT. FIG. 14 is a circuit diagram schematically showing the circuit when the offset error is full-code. Referring to FIG. 14, the correction switch group 9 applies a constant voltage to the correction capacitance array 7. For example, the correction switch group 9 applies the upper-limit reference voltage VT to a half of the capacitance of the correction capacitance array 7 and applies the lower-limit reference voltage VB to the remaining half of the capacitance so as to be set to an intermediate value of a correction range.

It should be noted that when the zero-code signal 44 is in the high level (when the offset error is zero-code in the first-time offset error detection), the reference voltage switch 63 connects the second common connection node 61 to the lower-limit reference voltage supplying line 3 in response to the seventh control signal 86. Thus, the voltage of the second common connection node 61 becomes equivalent to the lower-limit reference voltage VB. Further, when the offset error is neither the zero-code nor the full-code, the second-time offset error detection is unnecessary.

Figure 15:
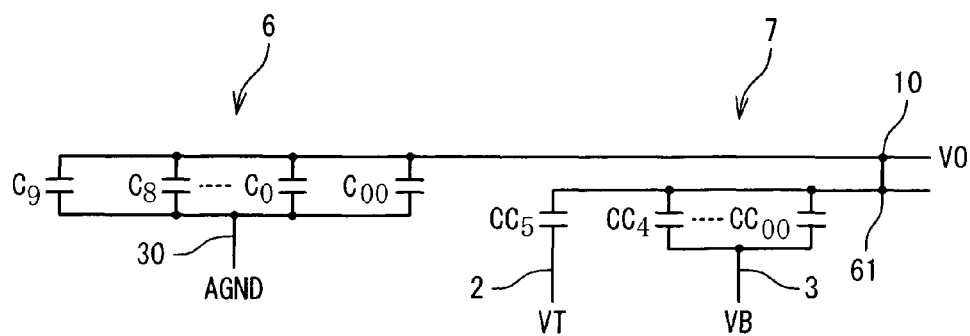

When the counting operation during the sampling period ends, the counter 71 outputs the sampling period signal TCG 22 in the low level. In accordance with the sampling period signal TCG 22 in the low level, the feedback switch 12 and the first switch 5 are inactivated. At this time, the first common connection node 10 and the second common connection node 61 turn into a high impedance state. Also, when the sampling period ends, the node connection switch 62 is activated in response to the fifth control signal 84. FIG. 15 is a circuit diagram schematically showing the circuit in such a state. Referring to FIG. 15, the electric charges stored in all the capacitance elements of the main capacitance array 6 and the correction capacitance array 7 are synthesized and stored by closing the node connection switch 62.

Supposing that the voltages of the first common connection node 10 and the second common connection node 61 in that state are V0, V0 can be calculated by the following equation (8).

$$(1C \times 2^{10}) \times (AGND - VCOM) + (1C \times 2^5) \times (VB - VT) = \qquad (8)$$
$$(1C \times 2^{10}) \times (AGND - V0) +$$
$$(1C \times 2^5) \times (VT - V0) + (1C \times 2^5) \times (VB - V0)$$

From the equation (8), the following equation (9) can be obtained.

$$V0 = VCOM + \left(\frac{2^6}{2^{10} + 2^6}\right) \times (VT - VCOM) \qquad (9)$$

From the equation (9), it can be found that there is a change of a voltage that is expressed as follows at this point.

$$\left(\frac{2^6}{2^{10} + 2^6}\right) \times (VT - VCOM)$$

Figure 16:
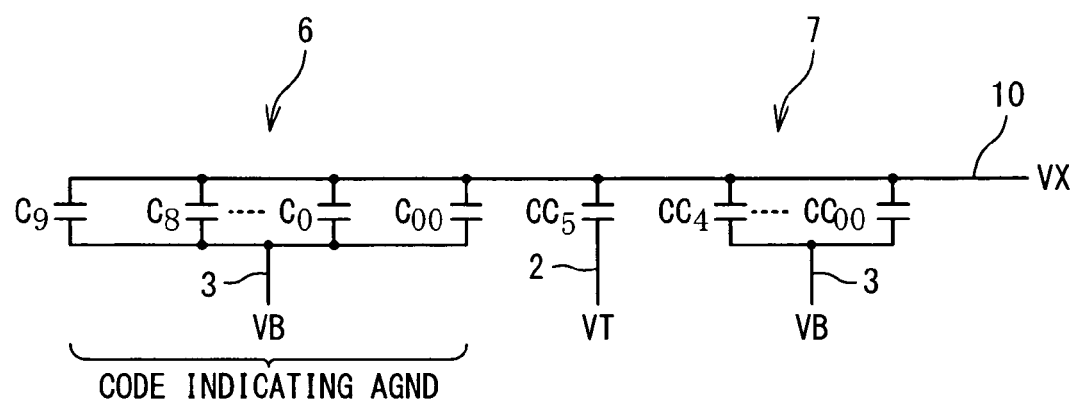

By utilizing it for correcting the offset, the correction capacitance array 7 can be utilized effectively. Thereafter, in the period T0, the voltage according to the code (theoretical value) indicating the analog ground voltage signal AGND is applied to each capacitance element of the main capacitance array 6. FIG. 16 is a circuit diagram schematically showing the circuit in such a state.

In the period T0, the logic value of the first bit (MSB) of the successive approximation register SAR 14 is set to "1". In the A/D converting operation for detecting the offset error, the capacitance array that is used by the successive approximation type A/D converter 60 during the comparing period is the correction capacitance array 7. The correction capacitance array 7 is of 6 bits. Thus, the successive approximation register SAR 14 operates as a 6-bit register.

The first bit of the successive approximation register SAR 14 corresponds to the data $D_5$ of the first data bus 15. By setting the logic value of the first bit (MSB) of the successive approximation register SAR 14 to "1", the logic value of the data $D_5$ of the first data bus 15 is set to "1". The latch circuit 40 outputs the data, which is supplied via the first data bus 15, to the second data bus 41 as it is. The correction switch control circuit 17 controls the correction switch group 9 based on the code supplied via the second data bus 41. The voltage to be applied to each of the capacitance elements of the correction capacitance array 7 is changed by controlling the correction switch group 9.

Through the change in the voltage to be supplied to each capacitance element of the correction capacitance array 7, the voltage of the first common connection node 10 is changed. The voltage comparator 11 compares the voltage of the first common connection node 10 after the change and the voltage (VCOM) of the first common connection node 10 during the sampling period TCG. The voltage comparator 11 outputs the voltage comparator output 13 indicating the logic value of "1", when the voltage (VCOM) of the first common connection node 10 during the sampling period TCG is higher. Meanwhile, the voltage comparator 11 outputs the voltage comparator output 13 indicating the logic value of "0" for the opposite case. When the logic value indicated by the voltage comparator output 13 is "1", the successive approximation register SAR 14 keeps the logic value of the first bit to be "1". For the opposite case, the successive approximation register SAR 14 changes the logic value of the first bit to "0".

In the same manner, the comparing operation of the voltage of the first common connection node 10 after the change and the voltage (VCOM) of the first common connection node 10 during the sampling period TCG is repeated from the period T1 to the period T5. The data determined by repeating the comparing operation to the lowest bit (LSB) of the successive approximation register SAR 14 is a final offset error data. By use of this error data, the offset error can be corrected.

Figure 17:
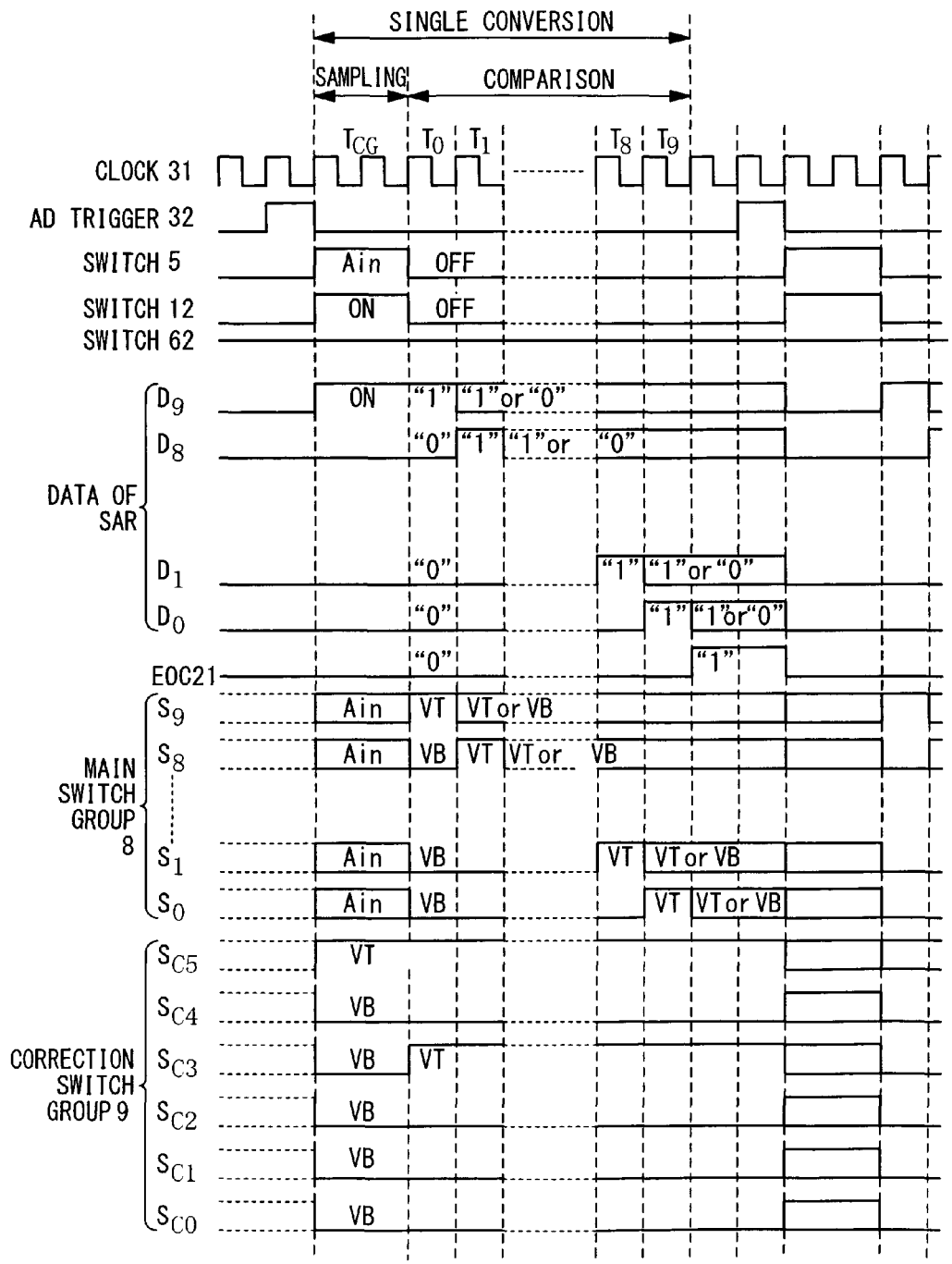
FIG. 17 shows timing charts an A/D converting operation for correcting an offset error in the successive approximation type A/D converter according to the first embodiment of the present invention.

Next, the A/D converting operation for correcting the offset error will be described with reference to a timing chart shown in FIG. 17. The offset error correction is achieved by performing the A/D conversion during the sampling period TCG and the comparing periods T0-T9. In the A/D conversion operation for correcting the offset error in this embodiment, when the offset error to be corrected is extremely large, the correction capacitance array is separated by the node connection switch 62 during the sampling period, and a voltage that is different from that of the first common connection node 10 is charged or biased to the second common connection node 61.

The A/D converting operation for correcting the offset error is started by setting the A/D trigger 32 to the high level. When the A/D trigger 32 is set to the high level, the counter 71 outputs the sampling period signal TCG 22 in the high level in response to the A/D trigger 32. The successive approximation type A/D converter 60 performs sampling of the analog input voltage signal Ain in response to the A/D trigger 32 in the high level.

Specifically, at this time, the first buffer 74 outputs the first control signal 80 for activating the feedback switch 12 in response to the sampling period signal TCG 22 in the high level. Because the feedback switch 12 is closed, the first common connection node 10 is biased to the constant voltage (VCOM). The second logic circuit 76 supplies the third control signal 82 to the first switch 5, so as to connect the analog input voltage supplying line 1 (the analog input voltage signal Ain side) to the sample voltage supplying line 4. The second buffer 75 supplies the second control signal 81 to the main switch group 8, so as to connect the main capacitance array 6 to the sample voltage supplying line 4. Thus, all the capacitance elements of the main capacitance array 6 are charged to the analog input voltage signal Ain.

Figure 18:
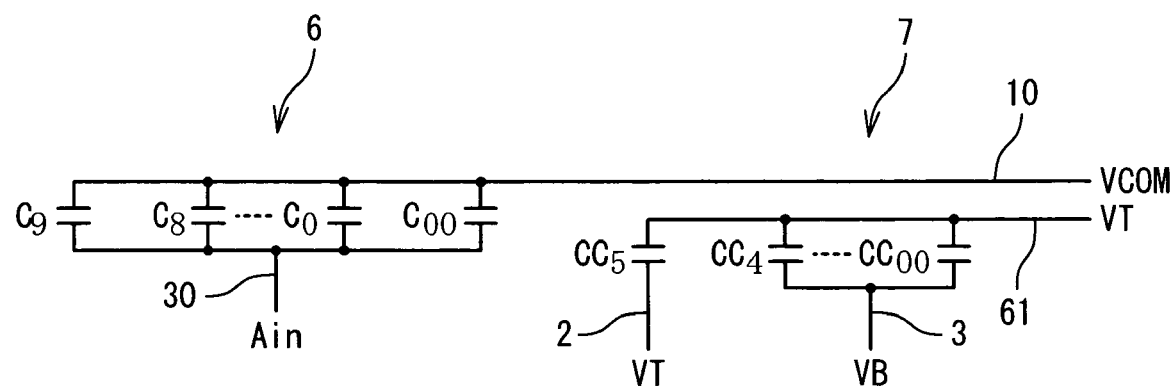
FIGS. 18 to 20 are schematic diagrams showing connection states in the successive approximation type A/D converter according to the first embodiment of the present invention.

At this time, the node connection switch 62 is in the open state. Thus, the second common connection node 61 and the first common connection node 10 are in the disconnection state. FIG. 18 is a circuit diagram schematically showing the circuit in such a state. In FIG. 18, the upper-limit reference voltage VT is applied to a half of the capacitance, and the lower-limit reference voltage VB is applied to the remaining half of the capacitance so as to set to the intermediate value of the correction range.

Here, when the full-code signal 43 is in the high level, the reference voltage switch 63 connects the upper-limit reference voltage supplying line 2 to the second common connection node 61 in response to the sixth control signal 85. Thus, the voltage of the second common connection node 61 becomes equivalent to the upper-limit reference voltage VT. Oppositely, when the zero-code signal 44 is in the high level, the reference voltage switch 63 connects the lower-limit reference voltage supplying line 3 to the second common connection node 61 in response to the seventh control signal 86. Thus, the voltage of the second common connection node 61 becomes equivalent to the lower-limit reference voltage VB. When both the full-code signal 43 and the zero-code signal 44 are in the low level, the node connection switch 62 is closed. Therefore, the voltage of the second common connection node 61 becomes the same voltage as that of the voltage (VCOM) of the first common connection node 10. Further, the correction switch group 9 applies the same constant voltage as the voltage at the time of the offset error detection.

Figure 19:
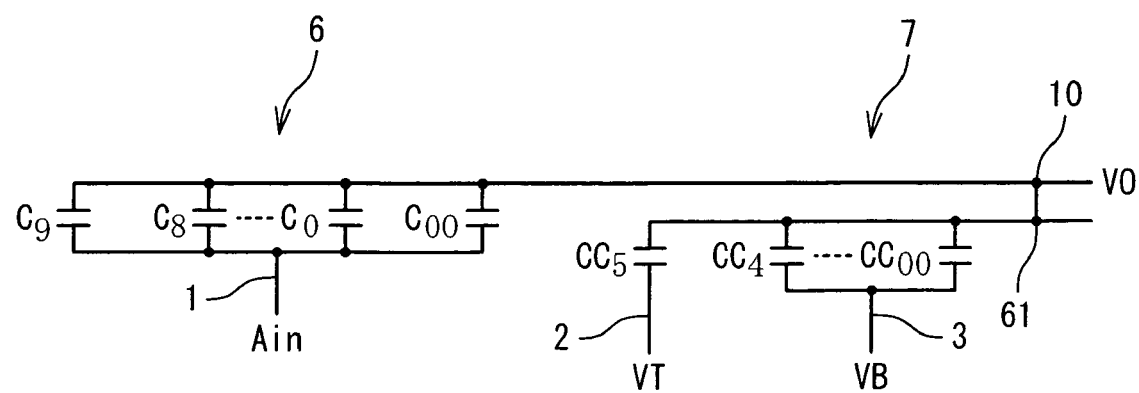

When the counting operation during a prescribed sampling period ends, the counter 71 outputs the sampling period signal TCG 22 in the low level. In response to the sampling signal TCG 22 in the low level, the feedback switch 12, the reference voltage switch 63, and the first switch 5 are inactivated. When the feedback switch 12, the reference voltage switch 63, and the first switch 5 are set to the open state, the first common connection node 10 and the second common connection node 61 turn into a high-impedance state. Further, the node connection switch 62 at this time is activated. FIG. 19 is a circuit diagram schematically showing the circuit in such a state. The electric charges stored in all the capacitance elements of the main capacitance array 6 and the correction capacitance array 7 are synthesized and stored by closing the node connection switch 62. Furthermore, an amount of electric charge Q5 to be stored can be expressed by the following equation (10).

$$Q5=(1C\times 2^{10})\times(Ain-VCOM)+(1C\times 2^5)\times(VT-VCOM)+ (1C\times 2^5)\times(VB-VT) \quad (10)$$

The voltages of the first common connection node 10 and the second common connection node 61 become the same voltage as is expressed by the equation (9). At this point, there is a change in the voltage by an amount that is expressed as follows, which attributes to the offset correction.

$$\left(\frac{2^6}{2^{10}+2^6}\right)\times(VT-VCOM)$$

Thereafter, the control circuit 34 performs a control for applying the voltage determined based on the offset error to the correction capacitance array 7 during the comparing periods T0-T9. The data indicating the offset error is stored in the latch circuit 40. In response to the control signal 35 outputted from the control circuit 34, the successive approximation type A/D converter 60 applies to the correction capacitance array 7, the voltage corresponding to the data stored in the latch circuit 40.

Figure 20:
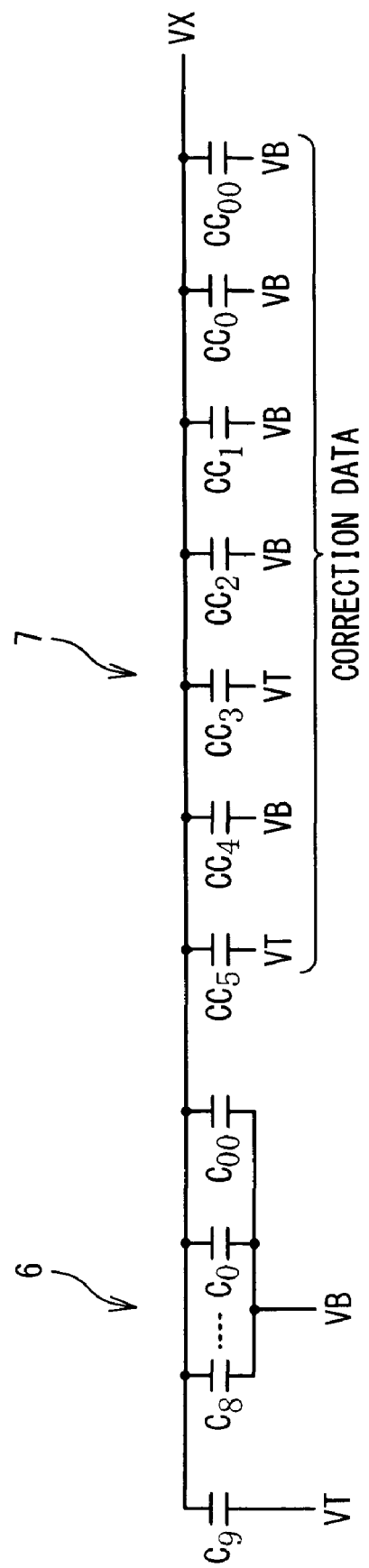

Assuming that the correction code of the offset error indicates the voltage for 40 LSB, the upper-limit reference voltage VT is applied to the capacitance elements $CC_5$ and $CC_3$. FIG. 20 is a circuit diagram schematically showing the circuit in such a state. The capacitance element $CC_5$ corresponds to $2^5$ times as that of the unit capacitance element. The capacitance element $CC_3$ corresponds to $2^3$ times as that of the unit capacitance element. Further, the lower-limit reference voltage VB is applied to the remaining half of the capacitance (the actual correction amount is the voltage corresponding to "the amount of change in the voltage expressed by the equation (9)+40 LSB−32 LSB=8 LSB").

The control circuit 34 sets the logic value of the first bit (MSB) of the successive approximation register SAR 14 to "1" in the period T0. Since the logic value of the first bit (MSB) of the successive approximation register SAR 14 is "1", the logic value of the data $D_9$ of the first data bus 15 becomes "1".

The main switch control circuit 16 controls the main switch group 8 in response to the correction code supplied via the first data bus 15. The main switch group 8 controlled by the main switch control circuit 16 switches the voltages to be supplied to capacitance elements of the main capacitance array 6. In the period T0, the switches S8-S00 of the main switch group 8 are made to connect to the lower-limit reference voltage VB, and the switch S9 is made to connect to the upper-limit reference voltage VT.

Thus, the lower-limit reference voltage VB is applied to a half of the capacitance of the main capacitance array 6, and the upper-limit reference voltage VT is applied to the remaining half of the capacitance.

An amount Q6 of electric charges stored to the main capacitance array 6 and the correction capacitance array 7 can be expressed by the following equation (11), provided that the voltage of the first common connection node 10 is VX.

$$Q6=(1C \times 2^9) \times (VT-VX)+(1C \times 2^9) \times (VB-VX)+\{1C \times (2^5+2^3)\} \times (VT-VX)+\{1C \times (2^1+2^1+2^1+2^2+2^4)\} \times (VB-VX) \quad (11)$$

The electric charge amount Q5 stored in the main capacitance array 6 and the correction capacitance array 7 during the sampling period remains as it is, at this point. Thus, the voltage (VX) of the first common connection node 10 can be found by setting "Q5=Q6" from the equation (10) and equation (13). Therefore, the voltage (VX) of the first common connection node 10 is the voltage that is expressed by the following equation (12).

$$VX = \left(\frac{2^{10}}{2^{10}+2^6}\right) \times \left(\frac{VT+VB}{2} - Ain\right) + VCOM + \left(\frac{1}{2^{10}+2^6}\right) \times \{2^6 \times (VT - VCOM) + 8LSB\} \quad (12)$$

As shown by the equation (14), it can be determined that a sum of the change amount in the voltage expressed by the equation (9) and the voltage for the correction data (8 LSB) of the offset error is corrected.

The voltage comparator 11 compares the voltage (VX) of the first common connection node 10 expressed by the equation (14) and the voltage (VCOM) of the first common connection node 10 during the sampling period TCG. The voltage comparator 11 outputs the voltage comparator output 13 indicating the logic value of "1", when the voltage VCOM of the first common connection node 10 during the sampling period TCG is higher. The voltage comparator 11 outputs the voltage comparator output 13 indicating the logic value of "0" for the opposite case.

When the logic value of the voltage comparator output 13 is "1", the successive approximation register SAR 14 keeps the logic value of the first bit (MSB) to be "1". Thus, the logic value of the data D9 of the first data bus 15 remains in the logic value of "1". When the logic value of the voltage comparator output 13 is "0", the successive approximation register SAR 14 changes the logic value of the first bit (MSB) to "0". Thus, the logic of the data D9 of the first data bus 15 becomes "0". Thus, in this operation, the comparing operation of the first bit (MSB) is ended.

From the period T1 to the period T9, the similar operation is repeated. The data generated as a result of correcting the lowest bit (LSB) of the successive approximation register SAR 14 is the result obtained by performing the A/D conversion on the analog input signal Ain. The A/D conversion result output buffer 18 outputs a data supplied from the successive approximation register SAR 14 at this time as the A/D conversion result 19 with the offset error being corrected.

As described above, the successive approximation type A/D converter 60 of the first embodiment includes the node connection switch 62 between the common electrode (the second common connection node 61) of the correction capacitance array 7 and the common electrode (the first common connection node 10) of the main capacitance array 6. Through the effect of the node connection switch 62, a different voltage from that of the common electrode of the main capacitance array 6 can be supplied to the common electrode of the correction capacitance array 7 during the sampling period. By controlling the voltage of the common electrode of the correction capacitance array 7 in this manner, a range of the voltages to be corrected by the correction capacitance array 6 can be expanded.

Comparison Example

A comparison between the present embodiment and the related art will be described below for easy understanding of the present invention. In the followings, how much the voltage at the common connection point of the capacitance array, i.e., at the input node of the voltage comparator by the correction capacitance array in the present embodiment and by the correction capacitance array in the related art can be changed will be discussed.

When the voltage at the input node of the voltage comparator is changed to a higher side to the maximum in the related art, the lower-limit reference voltage is applied to the whole correction capacitance array during the sampling period. Further, the upper-limit reference voltage is applied to the whole correction capacitance array during the comparing period. Thus, the voltage at the input node of the voltage comparator can be changed to the high side to the maximum.

The amount of electric charge Q1 stored in the capacitance array during the sampling period is expressed by the following equation (13), provided that a total capacitance value of the main capacitance array 6 is Ctotal and a total capacitance value of the correction capacitance array 7 is CCtotal.

$$Q1 = Ctotal \times (Ain - VCOM) + CCtotal \times (VB - VCOM) \quad (13)$$

Further, the amount of electric charge Q2 that is stored in the capacitance array during the comparing period (when the sequential comparing operation is ended, and the analog input voltage signal and the voltage indicated by the successive approximation register become equivalent at last) is expressed by the following equation (14).

$$Q2 = Ctotal \times (Ain - VX) + CCtotal \times (VT - VX) \quad (14)$$

From the equation (13) and the equation (14), the following equation (15) can be obtained.

$$VX = \left(\frac{CCtotal}{Ctotal + CCtotal}\right) \times (VT - VB) + VCOM \quad (15)$$

From this, it can be found that the there is a change in the voltage by an amount that is expressed as follows.

$$\left(\frac{CCtotal}{Ctotal + CCtotal}\right) \times (VT - VB)$$

In the meantime, when the circuit configuration according to the embodiment is employed, it is possible to apply the upper-limit reference voltage to the common connection point of the correction capacitance array 7 and apply the lower-limit reference voltage to the electrode of a switch side during the sampling period. During the comparing period, the common capacitance point of the main capacitance array 6 is connected to the common connection point of the correction capacitance array 7, and the upper-limit reference voltage is applied. In this case, the amount of electric charge Q3 that is stored in the capacitance array during the sampling period is expressed by an equation (16).

$$Q3 = C\text{total} \times (Ain - VCOM) + CC\text{total} \times (VB - VT) \tag{16}$$

The amount of electric charge Q4 that is stored in the capacitance array during the comparing period is expressed by the following equation (17).

$$Q4 = C\text{total} \times (Ain - VX) + CC\text{total} \times (VT - VX) \tag{17}$$

From the equation (16) and the equation (17), the following equation (18) can be obtained.

$$VX = \left(\frac{CC\text{total}}{C\text{total} + CC\text{total}}\right) \times (2VT - VB) + \left(\frac{CC\text{total}}{C\text{total} + CC\text{total}}\right) \times VCOM \tag{18}$$

From this, it is found that the there is a change in the voltage by an amount that is expressed as follows.

$$\left(\frac{CC\text{total}}{C\text{total} + CC\text{total}}\right) \times (2VT - VB - VCOM)$$

VCOM is the operating point voltage of the voltage comparator 11, and it is normally set approximately to a half of the supply voltage. Therefore, provided that $$VCOM = 1/2 \times AVDD$$

and $$VT = AVDD, VB = 0,$$

$$2VT - VB - VCOM = 3/2 \cdot AVDD$$

is obtained. From this, it is found that the voltage of 1.5 times as that of the related art technique, $$VT - VB = AVDD$$

can be changed. That is, the error amount corrected by employing the circuit configuration of this embodiment can be increased by 1.5 times, compared with that of the related art, when the same capacity value is added as the correction capacitance array.

In other words, the capacitance element to be added for achieving the same amount of correction can be reduced to two thirds in the present invention. Even if VCOM is not a half of the supply voltage, this effect can be obtained as long as $$VT > VCOM$$

since $$(2VT - VB - VCOM) - (VT - VB) = VT - VCOM.$$

Second Embodiment

Figure 21:
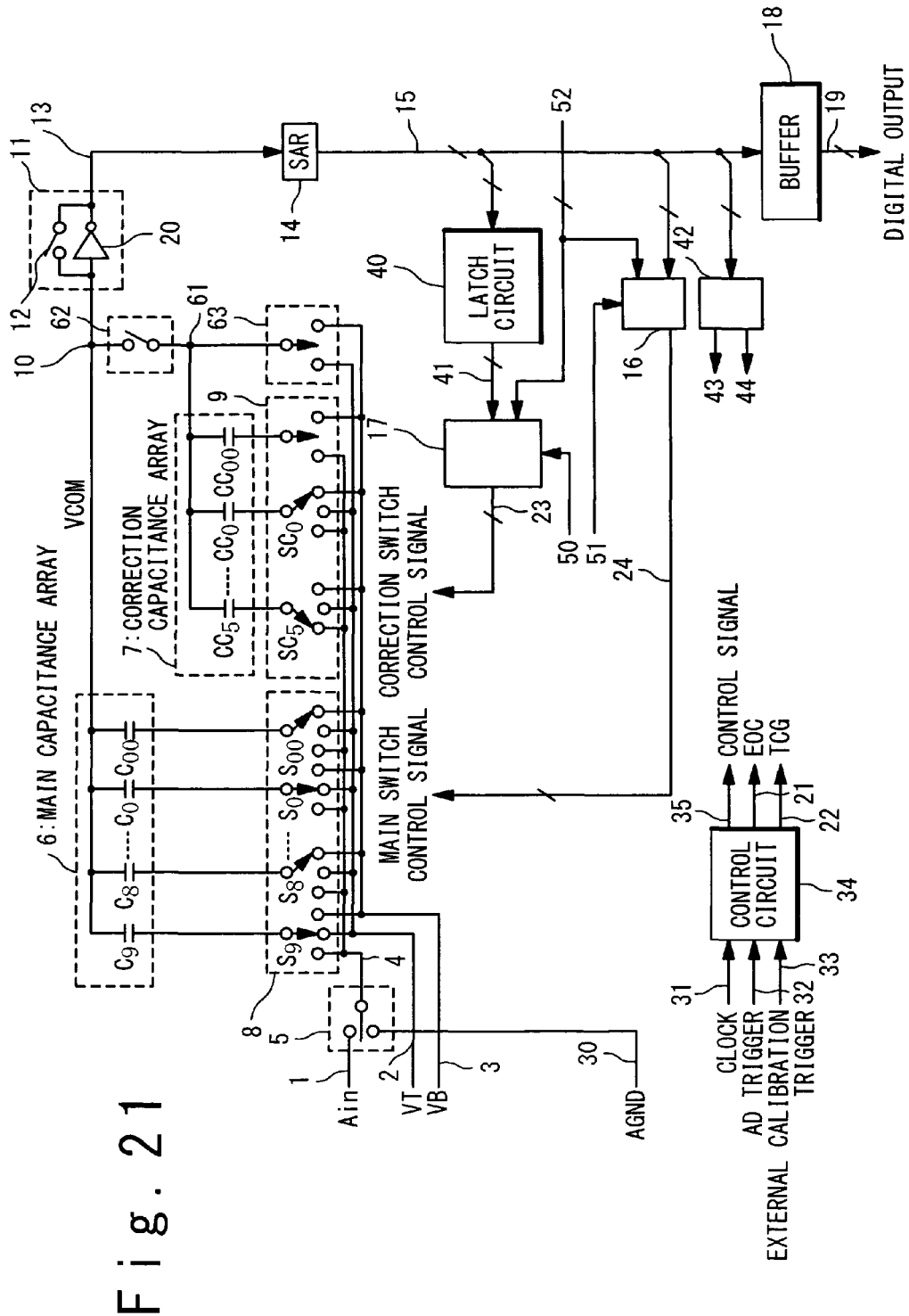
FIG. 21 is a circuit block diagram showing a configuration of the successive approximation type A/D converter according to a second embodiment of the present invention.

Next, the successive approximation type A/D converter 60 according to a second embodiment of the present invention will be described below with reference to the drawings. FIG. 21 is a circuit block diagram showing a circuit configuration of the successive approximation type A/D converter 60 according to the second embodiment.

Referring to FIG. 21, a first gain error correction signal (for amplification) 50, a second gain error correction signal (for attenuation) 51, and a gain error correction data 52 are supplied to the successive approximation type A/D converter 60 in the second embodiment. Further, the correction switch group 9 in the successive approximation type A/D converter 60 can perform sampling of the analog input voltage signal Ain.

There is a case that an amplifier is connected to an analog input stage of the successive approximation type A/D converter 60. Further, there is a case that a plurality of sample-and-hold circuits are connected to the successive approximation type A/D converter 60. In such cases, the successive approximation type A/D converter 60 performs A/D conversions on a plurality of analog input signals at same timing by the effect of the plurality of sample-and-hold circuits. The successive approximation type A/D converter 60 in the second embodiment can correct a gain error, when a gain error is generated in the amplifier and the sample-and-hold circuits which are connected to the analog input stage, for example. The A/D converting operation of the successive approximation type A/D converter 60 in the second embodiment to correct the gain error will be described with reference to a timing chart shown in FIG. 22.

Figure 22:
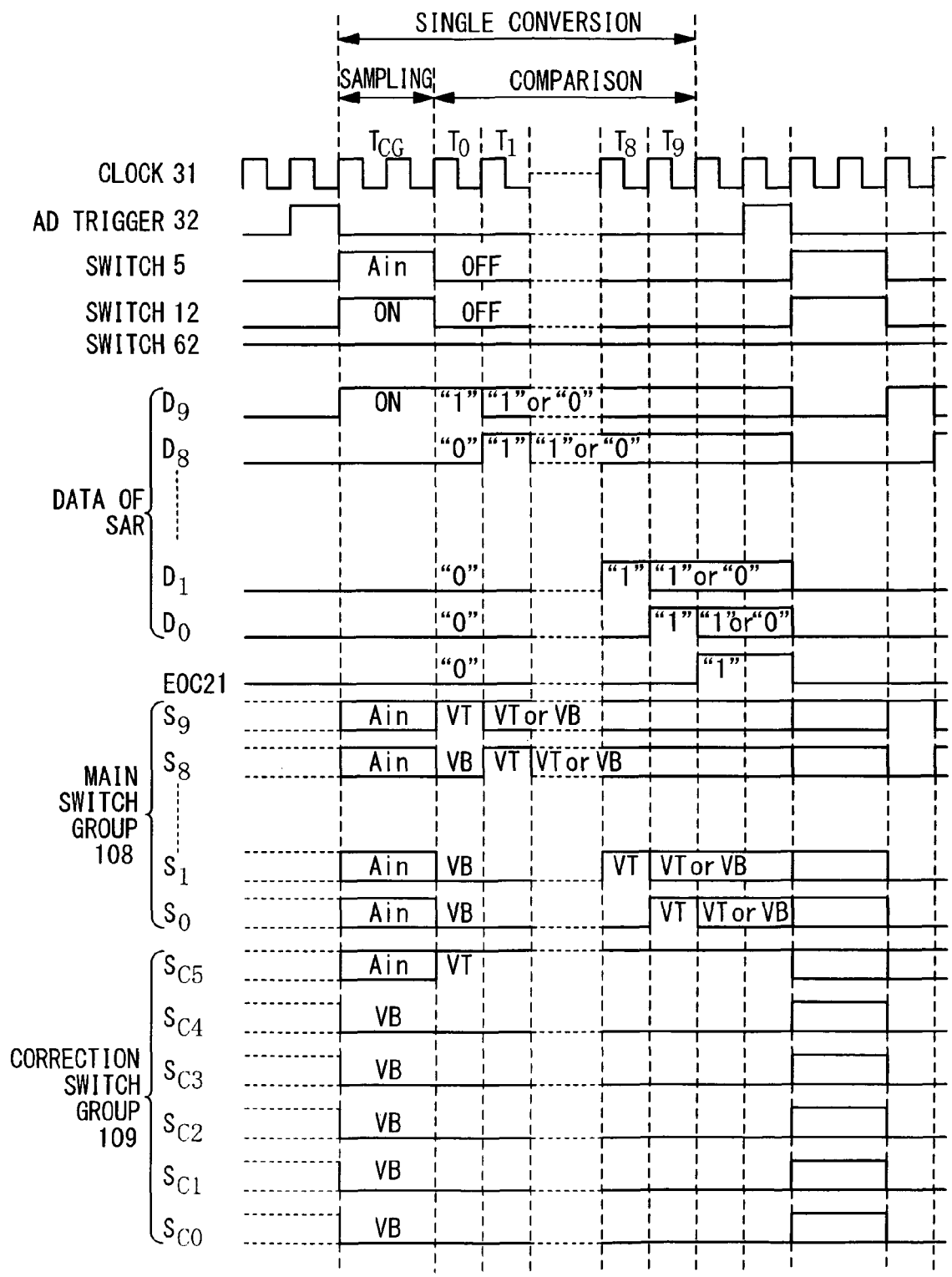
FIG. 22 shows timing charts of an A/D converting operation for correcting a gain error in the successive approximation type A/D converter according to the second embodiment of the present invention.

Referring to FIG. 22, the A/D converting operation to correct the gain error is performed during the sampling period TCG and the comparing periods T0-T9. The successive approximation type A/D converter 60 in the second embodiment changes the capacitance element for sampling the analog input voltage signal Ain during the sampling period TCG.

When it is necessary to amplify the analog input signal, the first gain error correction signal (for amplification) 50 in the high level is supplied to the correction switch control circuit 17. The correction switch control circuit 17 performs a control such that sampling of the analog input voltage signal Ain is performed in a part of the correction capacitance array 7 in response to the first gain error correction signal (for amplification) 50. Oppositely, when it is necessary to attenuate the analog input signal, the second gain error correction signal (for attenuation) 51 in the high level is supplied to the main switch control circuit 16. The main switch control circuit 16 performs a control such that sampling of the analog input voltage signal Ain is not performed in a part of the main capacitance array 6, in response to the second gain error correction signal (for attenuation) 51. Hereinafter, the successive approximation type A/D converter 60 in the second embodiment will be described with reference to the case that the analog input voltage signal Ain is to be amplified.

The A/D converting operation to correct the gain error is started by outputting the A/D trigger 32 in the high level in the state that the first gain error correction signal (for amplification) 50 is set to high level. When the A/D trigger 32 is set to the high level, the control circuit 34 outputs the sampling period signal TCG 22 in the high level. The successive approximation type A/D converter 60 performs sampling of the analog input voltage signal Ain in response to the sampling period signal TCG 22. Here, it is to be focused on correcting the gain error. Thus, it is assumed that the node connection switch 62 is closed at all times.

Figure 23:
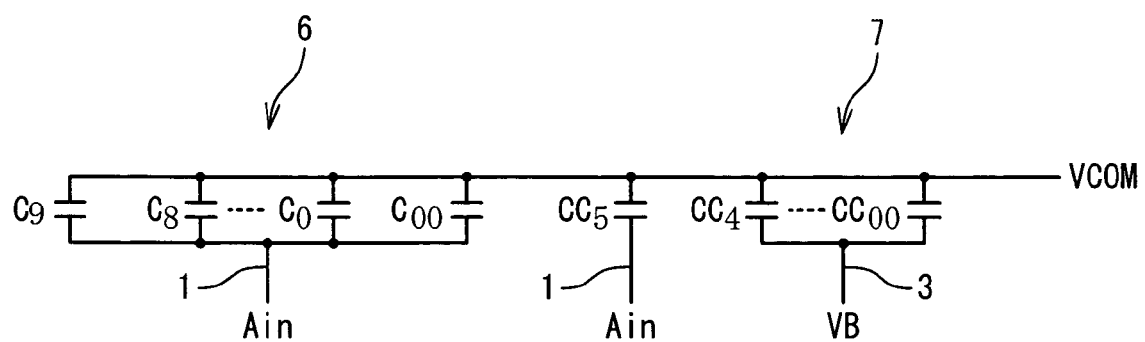
FIGS. 23 and 24 are schematic diagrams showing connection states in the successive approximation type A/D converter according to the second embodiment of the present invention.

At this time, the control circuit 34 sets the feedback switch 12 to bias the voltages of the first common connection node 10 and the second common connection node 61 to the constant voltage VCOM. Further, the control circuit 34 sets the first switch 5 to the side of the analog input voltage signal Ain. Furthermore, the control circuit 34 sets all the switches of the main switch group 8 to the side of the sample voltage supplying line 4. Thus, the analog input voltage signal Ain is charged to all the capacitance elements of the main capacitance array 6. Further, based on the gain error correction data 52, a part of the correction switch group 9 is set to the side of the sample voltage supplying line 4, and the constant voltage is applied to the remaining switches. FIG. 23 is a circuit diagram schematically showing the circuit in such a state. In FIG. 23, the analog input voltage signal Ain is applied to a half of the capacitance, and the lower-limit reference voltage VB is applied to the remaining half of the capacitance.

When the counting operation of a prescribed sampling period ends, the control circuit 34 sets the sampling period signal TCG 22 to the low level. In response to the low level sampling period signal TCG 22 in the low level, the feedback switch 12 and the first switch 5 are inactivated. When the feedback switch 12 and the first switch 5 are opened, the first common connection node 10 and the second common connection node 61 turn into a high-impedance state. Thus, the electric charges stored in all the capacitance elements of the main capacitance array 6 and the correction capacitance array 7 remain as they are. An amount of electric charge Q7 to be stored can be expressed by the following equation (19).

$$Q7=(1C \times 2^{10}) \times (Ain-VCOM)+(1C \times 2^5) \times (Ain-VCOM)+ \\ (1C \times 2^5) \times (VB-VCOM) \quad (19)$$

Figure 24:
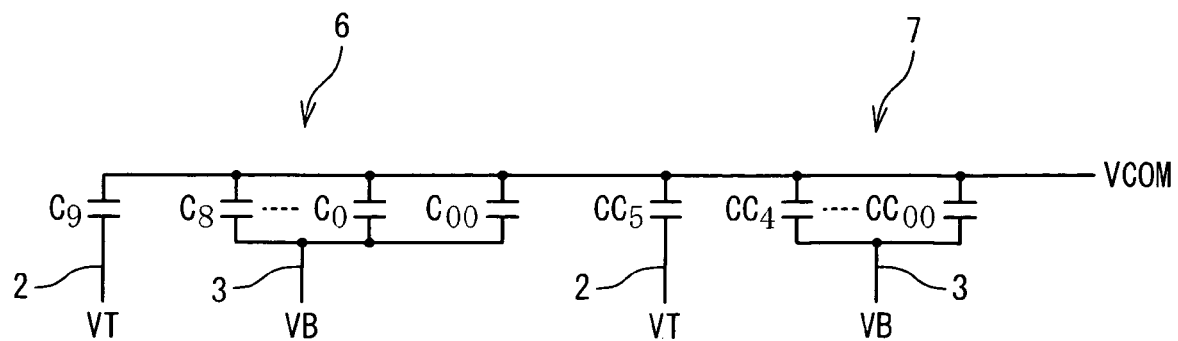

The control circuit 34 sets the logic value of the first (MSB) bit of the successive approximation register SAR 14 in the period T0 as "1" so as to set the logic value of the data D9 of the first data bus 15 as "1". In accordance with the code of the first data bus 15, the main switch control circuit 16 controls the main switch group 8 so as to change a voltage to be applied to each of the capacitance elements of the main capacitance array 6. In the period T0, the switches S8-S00 of the main switch group 8 are set to the side of the lower-limit reference voltage VB, and the switch S9 is set to the side of the upper-limit reference voltage VT. FIG. 24 is a circuit diagram schematically showing the circuit in such a state. Thus, the lower-limit reference voltage VB is applied to a half of the capacitance of the main capacitance array 6, and the upper-limit reference voltage VT is applied to the remaining half of the capacitance. Further, during the comparing periods T0-T9, the control circuit 34 outputs the control signal 35 to apply the constant voltage to the correction capacitance array 7. In the circuit shown in FIG. 24, a half of the capacitance is set to the side of the upper-limit reference voltage VT, and the remaining capacitance elements are set to the side of the lower-limit reference voltage VB.

During the comparing period T0, an amount of electric charge Q8 stored in the main capacitance array 6 and the correction capacitance array 7 can be expressed by the following equation (20), provided that the voltage of the first common connection node 10 of the capacitance array is VX.

$$Q8=(1C \times 2^9) \times (VT-VX)+(1C \times 2^9) \times (VB-VX)+(1C \times 2^5) \times \\ (VT-VX)+(1C \times 2^5) \times (VB-VX) \quad (20)$$

The amount of electric charge Q7 (the electric charge that is stored in the main capacitance array 6 and the correction capacitance array 7 during the sampling period) remains as it is. Thus, the voltage (VX) of the first common connection node 10 can be found by setting "Q7=Q8" from the equation (19) and the equation (20). Thus, the voltage (VX) of the first common connection node 10 becomes a voltage expressed by the following equation (21).

$$VX = \left( \frac{2^{10}}{2^{10}+2^6} \right) \times \left\{ \frac{VT+VB}{2} - (2^{10}+2^5) \times \frac{Ain}{2^{10}} + \frac{VT}{2^5} \right\} + VCOM \quad (21)$$

As understood from the equation (21), it can be found that the analog input voltage signal Ain is amplified to the voltage of (210+25)/210 times. The voltage comparator 11 compares the voltage (VX) of the first common connection node 10 expressed by the equation (21) and the voltage (VCOM) of the first common connection node 10 during the sampling period TCG. The voltage comparator 11 outputs the voltage comparator output 13 to indicate the logic value of "1" when the voltage VCOM of the first common connection node 10 during the sampling period TCG is larger. The voltage comparator 11 outputs the voltage comparator output 13 to indicate the logic value of "0" for the opposite case.

When the logic of the voltage comparator output 13 is "1", the successive approximation register SAR 14 keeps the logic of the first bit (MSB) to be "1". Thus, the logic value of the data D9 of the first data bus 15 remains in the logic value of "1". When the logic value of the voltage comparator output 13 is "0", the successive approximation register SAR 14 changes the logic value of the first bit (MSB) to "0". Thus, the logic value of the data D9 of the first data bus 15 becomes "0". Thus, the comparing operation of the first bit (MSB) is ended in the operation.

The operation in the period T1 and the subsequent is the same as the basic A/D converting operation. The successive approximation register SAR 14 keeps the data determined by performing the comparing operation to the lowest bit (LSB). The successive approximation register SAR 14 supplies the held data to the first data bus 15 as the result obtained by performing A/D conversion on the analog input signal Ain. The A/D conversion result output buffer 18 outputs the data supplied via the first data bus 15 as a digital output 19 with the gain error being corrected.

When the accuracy of the amplifier and the sample-and-hold circuits connected to the analog input stage is to be improved, it is necessary to design the amplifier with an extremely large device size. An increase in the device size causes an increase in a parasitic capacitance. This makes it difficult to perform a high-speed operation, and also results in increasing a core size. The successive approximation type A/D converter 60 in the second embodiment can correct the gain error of the amplifier even in such a case by utilizing the correction capacitance elements.

It should be noted that while the second embodiment has been described with reference to the gain error correcting operation, the successive approximation type A/D converter 60 may also include a configuration of performing the offset error correction along with the gain error correcting operation. Thus, it becomes possible to correct the errors more appropriately.

Third Embodiment

Figure 25:
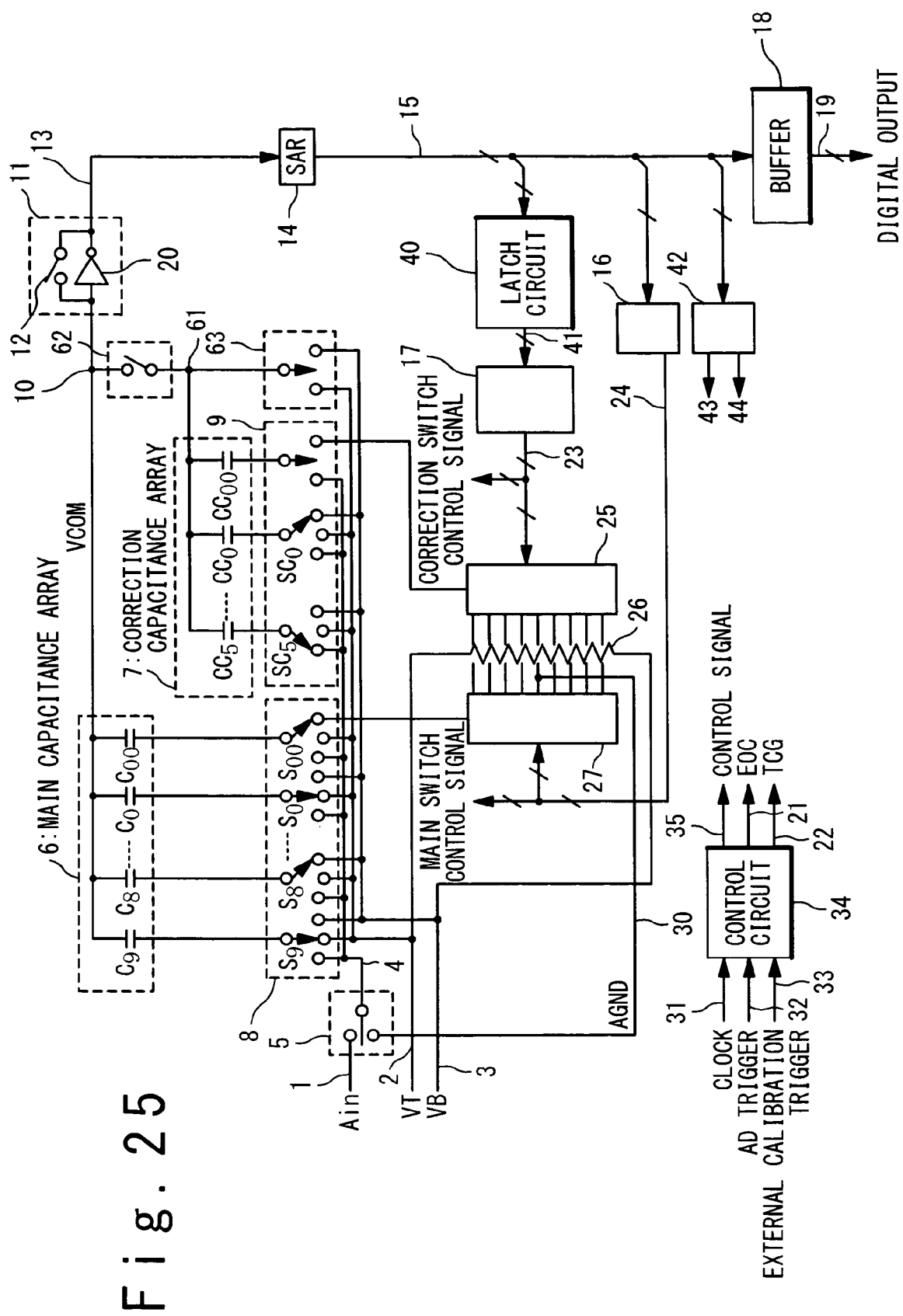
FIG. 25 is a circuit block diagram showing a configuration of the successive approximation type A/D converter according to a third embodiment of the present invention.

Next, the successive approximation type A/D converter 60 according to a third embodiment of the present invention will be described below. FIG. 25 is a circuit diagram showing a configuration of the successive approximation type A/D converter 60 according to the third embodiment of the present invention. Referring to FIG. 25, the successive approximation type A/D converter 60 in the third embodiment further includes a correction switch circuit network 25, a resistance string 26, and a switch circuit network 27 in addition to the first embodiment. An internal D/A converter includes the main capacitance array 6 and the resistance string 26. The switch circuit network 27, in combination with the resistance string 26, functions as the internal D/A converter. The switch circuit network 27 switches and outputs the voltage generated in the resistance string 26 in response to the control data 24 outputted by the main switch control circuit 16. The switch circuit network 27 applies the output voltage to one end of the switch $S_{00}$ of the main switch group 8. The correction switch circuit network 25, in combination with the resistance string 26, functions as a correction D/A converter. The correction switch circuit network 25 switches the voltage generated in the resistance string 26 in response to a correction switch group control signal 23 outputted by the correction switch control circuit 17. The correction switch circuit network 25 applies the output voltage to the capacitance element $CC_{00}$ of the correction capacitance array 7.

As in the above-described embodiments, the successive approximation type A/D converter 60 in the third embodiment includes the node connection switch 62 between the common electrode (the second common connection node 61) of the correction capacitance array 7 and the common electrode (the first common connection node 10) of the main capacitance array 6. By the effect of the node connection switch 62, a different voltage from that of the common electrode of the main capacitance array 6 can be supplied to the common electrode of the correction capacitance array 7 during the sampling period. By controlling the common electrode of the correction capacitance array 7 in this manner, the range of the voltages which can be corrected by the correction capacitance array 7 can be expanded.

Figure 26:
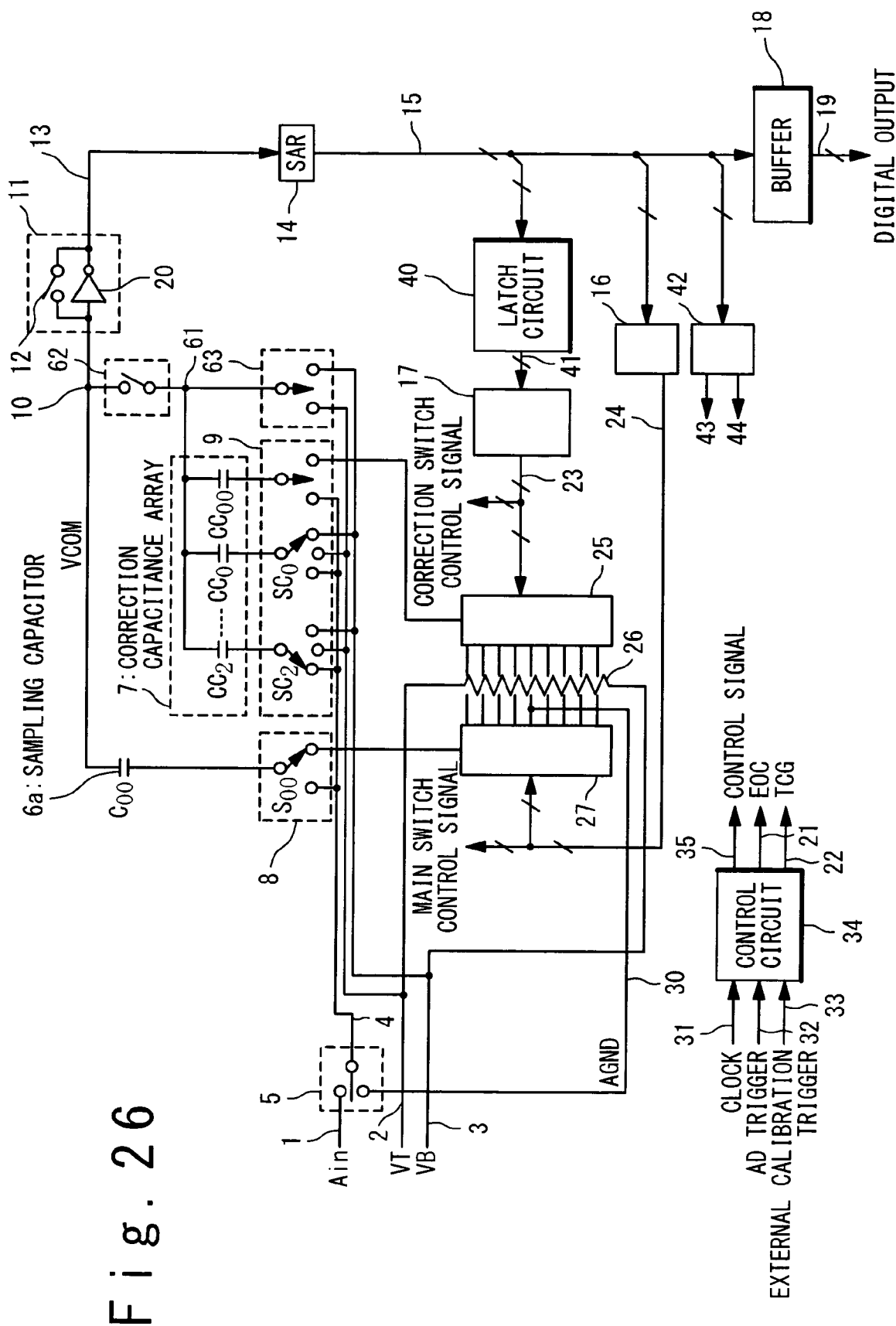
FIG. 26 is a circuit block diagram showing a configuration of the successive approximation type A/D converter according to a fourth embodiment of the present invention.

Further, FIG. 26 is a circuit diagram showing a configuration of the successive approximation type A/D converter 60 according to a fourth embodiment. As shown in FIG. 26, in the modification of the successive approximation type A/D converter 60, the internal D/A converter includes the resistance string 26 and a sampling capacitor 6a. In such a successive approximation type A/D converter 60, a different voltage from that of the common electrode of the main capacitance array can be supplied to the common electrode of the correction capacitance array 7 during the sampling period by the effect of the node connection switch 62.

As described above, the successive approximation type A/D converter 60 in the third embodiment can correct an offset error by use of the correction capacitance elements, even if the offset error is generated in the voltage comparator. At the same time, in the successive approximation type A/D converter 60 of this embodiment, only a small amount of the correction capacitance elements is required to be added for the amount of error to be corrected. Thus, an increase in a core size can be prevented. Further, the range of an error to be corrected by the correction capacitance elements can be expanded. Furthermore, even if there is a gain error in the amplifier that is connected to the analog input stage, it is possible to correct the gain error by the correction capacitance elements.

The above embodiments have been described with reference to the cases that the voltage to be applied to the common connection node of the correction capacitance array during the sampling period is selected from the three kinds of voltages, i.e., the upper-limit reference voltage (VT), the lower-limit reference voltage (VB), and VCOM. However, the voltage to be applied to the common connection node of the successive approximation type A/D converter 60 is not limited to the three kinds of voltages in the present invention, but another arbitrary voltage may also be applied. Furthermore, the above embodiments can be combined, as long as there is no confliction generated in the configuration and operations thereof.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. A successive approximation type A/D (analog to digital) converter comprising:

a main capacitance array connected with a common connection node;

a correction capacitance array;

a voltage comparator configured to detect a voltage of said common connection node;

a successive approximation register in which a value is set based on an output of said voltage comparator;

a first control circuit configured to change a voltage applied to capacitance elements of said main capacitance array and said correction capacitance array based on a value set in said successive approximation register;

a second control circuit configured to respond to a control signal to connect said main capacitance array to an input voltage signal or a first predetermined voltage, and said correction capacitance array to said common connection node or a second predetermined voltage, a connection switch provided between said main capacitance array and said correction capacitance array to selectively connect said correction capacitance array to said main capacitance array in response to a switch control signal, wherein said connection switch disconnects said main capacitance array from said correction capacitance array during a sampling period;

an upper limit voltage supply line on which an upper limit reference voltage is supplied;

a lower limit voltage supply line on which a lower limit reference voltage is supplied;

a reference voltage switch;

a correction switch group; and an input signal supply line on which said input analog voltage signal is supplied, wherein said reference voltage switch connects said correction capacitance array to said upper limit voltage supply line during the sampling period, and wherein said correction switch group connects said correction capacitance array to said lower limit voltage supply line during the sampling period.

2. The successive approximation type A/D converter according to claim 1, wherein:

said main capacitance array supplies a conversion signal generated in response to said input analog voltage signal to said voltage converter, and said correction capacitance array corrects an offset of said voltage comparator.

3. The successive approximation type A/D converter according to claim 1, wherein said connection switch connects said main capacitance array and said correction capacitance array in a comparing period.

4. The successive approximation type A/D converter according to claim 1, further comprising:

a resistance string; and a switch network configured to switch and output a voltage generated by said resistance string, wherein said main capacitance array comprises a plurality of capacitance elements, and wherein said switch network applies the voltage generated by said resistance string to at least one of said plurality of capacitance elements.

5. The successive approximation type A/D converter according to claim 1, wherein said main capacitance array comprises:
  sampling capacitance elements;
  a resistance string; and
  a switch network configured to switch and output a voltage generated by said resistance string,
  wherein said switch network applies the voltage generated by said resistance string to said sampling capacitance elements.

6. A successive approximation type A/D (analog to digital) converter comprising:
  a main capacitance array connected with a common connection node;
  a correction capacitance array;
  a voltage comparator configured to detect a voltage of said common connection node;
  a successive approximation register in which a value is set based on an output of said voltage comparator;
  a first control circuit configured to change a voltage applied to capacitance elements of said main capacitance array and said correction capacitance array based on a value set in said successive approximation register;
  a second control circuit configured to respond to a control signal to connect said main capacitance array to an input voltage signal or a first predetermined voltage, and said correction capacitance array to said common connection node or a second predetermined voltage,
  a connection switch provided between said main capacitance array and said correction capacitance array to selectively connect said correction capacitance array to said main capacitance array in response to a switch control signal,
  wherein said connection switch disconnects said main capacitance array from said correction capacitance array during a sampling period;
  an upper limit voltage supply line on which an upper limit reference voltage is supplied;
  a lower limit voltage supply line on which a lower limit reference voltage is supplied;
  a reference voltage switch; and
  a correction switch group,
  wherein said reference voltage switch connects said correction capacitance array to said upper limit voltage supply line during the sampling period, and
  wherein said correction switch group connects said correction capacitance array to said lower limit voltage supply line during the sampling period.

7. The successive approximation type A/D converter according to claim 6, further comprising:
  a main capacitance array switch group configured to control a voltage applied to said main capacitance array,
  wherein said main capacitance array comprises a plurality of capacitance elements, and
  wherein said main capacitance array switch group supplies a voltage which is different from said input analog voltage signal to a part of said plurality of capacitance elements.

* * * * *